(12) United States Patent
Sun et al.

(10) Patent No.: US 12,469,811 B2
(45) Date of Patent: Nov. 11, 2025

(54) PACKAGE COMPRISING WIRE BONDS COUPLED TO INTEGRATED DEVICES

(71) Applicant: QUALCOMM Incorporated, San Diego, CA (US)

(72) Inventors: Yangyang Sun, San Diego, CA (US); Rong Zhou, Cary, NC (US); Li-Sheng Weng, San Diego, CA (US); Lily Zhao, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 544 days.

(21) Appl. No.: 17/213,875

(22) Filed: Mar. 26, 2021

(65) Prior Publication Data

US 2022/0320026 A1   Oct. 6, 2022

(51) Int. Cl.
*H01L 23/00* (2006.01)
*H01L 23/16* (2006.01)
(Continued)

(52) U.S. Cl.
CPC .............. *H01L 24/14* (2013.01); *H01L 23/16* (2013.01); *H01L 23/31* (2013.01);
(Continued)

(58) Field of Classification Search
CPC ......... H01L 24/14; H01L 23/16; H01L 23/31; H01L 25/0655; H01L 23/5385; H01L 23/5386; H01L 23/49816; H01L 23/13; H01L 23/585; H01L 25/50; H01L 21/4857; H01L 23/5383; H01L 24/92; H01L 24/16; H01L 24/48; H01L 24/49; H01L 24/73; H01L 2224/131; H01L 2224/16227; H01L 2224/16235; H01L 2224/2919; H01L 2224/32225; H01L 2224/48101;
(Continued)

(56) References Cited

U.S. PATENT DOCUMENTS 5,599,747 A   2/1997  Bhatt et al.
5,723,906 A * 3/1998  Rush ...................... H01L 24/06
                                                         257/784
(Continued)

FOREIGN PATENT DOCUMENTS

CN       112071826 A    12/2020
EP         3742480 A1    11/2020
(Continued)

OTHER PUBLICATIONS

International Search Report and Written Opinion—PCT/US2022/017904—ISA/EPO—Jun. 22, 2022.

*Primary Examiner* — William B Partridge
*Assistant Examiner* — David Paul Sedorook
(74) *Attorney, Agent, or Firm* — Loza & Loza, LLP

(57) ABSTRACT

A package that includes a substrate comprising a cavity, a first integrated device coupled to the substrate through a first plurality of pillar interconnects and a first plurality of solder interconnects, a second integrated device coupled to the substrate through a second plurality of pillar interconnects and a second plurality of solder interconnects, and a plurality of wire bonds coupled to the first integrated device and the second integrated device, wherein the plurality of wire bonds is located over the cavity of the substrate.

25 Claims, 17 Drawing Sheets

*PROFILE VIEW*

(51) Int. Cl.
*H01L 23/31* (2006.01)
*H01L 23/538* (2006.01)
*H01L 25/065* (2023.01)

(52) U.S. Cl.
CPC ...... *H01L 23/5385* (2013.01); *H01L 23/5386* (2013.01); *H01L 25/0655* (2013.01)

(58) Field of Classification Search
CPC . H01L 2224/48137; H01L 2224/49175; H01L 2224/49431; H01L 2224/73204; H01L 2224/73207; H01L 2224/73215; H01L 2224/81815; H01L 2224/83102; H01L 2224/92125; H01L 2224/92127; H01L 2224/92147
See application file for complete search history.

(56) References Cited

U.S. PATENT DOCUMENTS

| | | | |
|---|---|---|---|
| 6,304,455 B1* | 10/2001 | Huber | H05K 5/0069 |
| | | | 29/842 |
| 8,294,255 B2 | 10/2012 | Kim | |
| 8,354,742 B2 | 1/2013 | Camacho et al. | |
| 8,546,955 B1 | 10/2013 | Wu | |
| 8,916,981 B2 | 12/2014 | Xiu et al. | |
| 9,059,179 B2 | 6/2015 | Karikalan et al. | |
| 9,076,754 B2 | 7/2015 | Hung et al. | |
| 9,368,450 B1 | 6/2016 | Gu et al. | |
| 9,379,090 B1 | 6/2016 | Syed et al. | |
| 9,418,966 B1 | 8/2016 | Kwon et al. | |
| 9,607,919 B2 | 3/2017 | Lee et al. | |
| 10,224,272 B2 | 3/2019 | Kim et al. | |
| 10,304,799 B2 | 5/2019 | Leuten et al. | |
| 10,361,170 B2 | 7/2019 | Pyo et al. | |
| 10,380,496 B2 | 8/2019 | Elsherbini et al. | |
| 10,418,329 B2 | 9/2019 | Li et al. | |
| 10,497,674 B2 | 12/2019 | Hiner et al. | |
| 10,510,669 B2 | 12/2019 | Braunisch et al. | |
| 10,510,721 B2 | 12/2019 | Bhagavat et al. | |
| 10,593,612 B2 | 3/2020 | Somma et al. | |
| 10,600,706 B2 | 3/2020 | Lee | |
| 10,784,232 B2 | 9/2020 | Hiner et al. | |
| 11,133,259 B2 | 9/2021 | Rubin et al. | |
| 11,282,806 B2 | 3/2022 | Sauter et al. | |
| 11,569,198 B2 | 1/2023 | Burton | |
| 2004/0065468 A1* | 4/2004 | Seuntjens | H01L 24/45 |
| | | | 174/94 R |
| 2006/0226527 A1 | 10/2006 | Hatano et al. | |
| 2010/0052106 A1* | 3/2010 | Lee | H01L 23/585 |
| | | | 257/E23.18 |
| 2010/0193577 A1 | 8/2010 | Van Buiten et al. | |
| 2010/0213566 A1* | 8/2010 | Ho | H01L 24/49 |
| | | | 257/784 |
| 2010/0327424 A1 | 12/2010 | Braunisch et al. | |
| 2011/0042806 A1 | 2/2011 | Koide et al. | |
| 2011/0122590 A1 | 5/2011 | Wilson et al. | |
| 2011/0215448 A1* | 9/2011 | Cho | H01L 23/495 |
| | | | 257/659 |
| 2013/0168854 A1* | 7/2013 | Karikalan | H01L 24/73 |
| | | | 257/784 |
| 2014/0117552 A1 | 5/2014 | Qian et al. | |
| 2014/0159228 A1 | 6/2014 | Teh et al. | |
| 2014/0264791 A1 | 9/2014 | Manusharow et al. | |
| 2014/0299999 A1 | 10/2014 | Hu et al. | |
| 2015/0001717 A1 | 1/2015 | Karhade et al. | |
| 2015/0001733 A1 | 1/2015 | Karhade et al. | |
| 2015/0084210 A1 | 3/2015 | Chiu et al. | |
| 2015/0091182 A1 | 4/2015 | Chiu et al. | |
| 2015/0116965 A1 | 4/2015 | Kim et al. | |
| 2016/0071818 A1 | 3/2016 | Wang et al. | |
| 2016/0093597 A1 | 3/2016 | Chang et al. | |
| 2016/0133571 A1 | 5/2016 | Lee et al. | |
| 2016/0141234 A1 | 5/2016 | We et al. | |
| 2016/0218082 A1* | 7/2016 | Lee | H01L 24/20 |
| 2016/0302308 A1 | 10/2016 | Lee et al. | |
| 2017/0178988 A1* | 6/2017 | Cheney | H01L 21/4853 |
| 2018/0005945 A1 | 1/2018 | Pietambaram et al. | |
| 2018/0040548 A1 | 2/2018 | Kim et al. | |
| 2018/0068980 A1 | 3/2018 | Clegg et al. | |
| 2018/0102311 A1 | 4/2018 | Shih | |
| 2018/0197846 A1 | 7/2018 | Chen et al. | |
| 2018/0226364 A1 | 8/2018 | Kim et al. | |
| 2019/0035757 A1* | 1/2019 | Yu | H01L 23/49811 |
| 2019/0109117 A1* | 4/2019 | Fang | H01L 24/96 |
| 2019/0189603 A1 | 6/2019 | Wang et al. | |
| 2019/0287908 A1 | 9/2019 | Dogiamis et al. | |
| 2019/0295952 A1 | 9/2019 | Sikka et al. | |
| 2020/0035603 A1 | 1/2020 | Rubin et al. | |
| 2020/0035604 A1 | 1/2020 | Rubin et al. | |
| 2020/0126928 A1 | 4/2020 | Cheah et al. | |
| 2020/0294920 A1 | 9/2020 | Hariri et al. | |
| 2020/0381361 A1 | 12/2020 | Zhao et al. | |
| 2020/0395313 A1 | 12/2020 | Mallik et al. | |
| 2021/0020605 A1 | 1/2021 | Hiner et al. | |
| 2021/0058085 A1 | 2/2021 | Clark et al. | |
| 2021/0134711 A1 | 5/2021 | Fang | |
| 2021/0134724 A1 | 5/2021 | Rubin et al. | |
| 2021/0134728 A1 | 5/2021 | Rubin et al. | |
| 2021/0320718 A1 | 10/2021 | Kalman et al. | |
| 2021/0398906 A1 | 12/2021 | Qian et al. | |
| 2022/0149005 A1 | 5/2022 | Sun et al. | |
| 2022/0189917 A1 | 6/2022 | Balboni et al. | |
| 2022/0199562 A1 | 6/2022 | Waidhas et al. | |
| 2022/0285315 A1* | 9/2022 | Lee | H01L 25/50 |
| 2022/0375838 A1 | 11/2022 | We | |
| 2023/0035627 A1 | 2/2023 | Patil | |
| 2023/0067914 A1 | 3/2023 | Lin et al. | |

FOREIGN PATENT DOCUMENTS

| | | |
|---|---|---|
| EP | 3275017 B1 | 7/2021 |
| JP | H08250653 A | 9/1996 |
| JP | 2006261311 A | 9/2006 |
| JP | 2011211194 A | 10/2011 |
| KR | 20170126506 A | 11/2017 |
| TW | 200636972 A | 10/2006 |
| TW | 202125759 A | 7/2021 |
| WO | 2017111790 A1 | 6/2017 |
| WO | 2017111957 A1 | 6/2017 |

* cited by examiner

PROFILE VIEW

*TOP PLAN VIEW*

PLAN VIEW

PLAN VIEW

PROFILE VIEW

PROFILE VIEW

PACKAGE COMPRISING WIRE BONDS COUPLED TO INTEGRATED DEVICES

FIELD

Various features relate to packages that include an integrated device, and more specifically to a package that includes an integrated device and a substrate.

BACKGROUND

FIG. 1 illustrates a package 100 that includes a substrate 102, an integrated device 104, and an integrated device 106. The substrate 102 includes at least one dielectric layer 120, a plurality of interconnects 122, and a plurality of solder interconnects 124. A plurality of solder interconnects 144 is coupled to the substrate 102 and the integrated device 104. A plurality of solder interconnects 164 is coupled to the substrate 102 and the integrated device 106. There is an ongoing need to provide packages with better performances.

SUMMARY

Various features relate to packages that include an integrated device, and more specifically to a package that includes an integrated device and a substrate.

One example provides a package that includes a substrate comprising a cavity, a first integrated device coupled to the substrate through a first plurality of pillar interconnects and a first plurality of solder interconnects, a second integrated device coupled to the substrate through a second plurality of pillar interconnects and a second plurality of solder interconnects, and a plurality of wire bonds coupled to the first integrated device and the second integrated device, wherein the plurality of wire bonds is located over the cavity of the substrate.

Another example provides an apparatus that includes a substrate comprising a cavity, a first integrated device coupled to the substrate through a first plurality of pillar interconnects and a first plurality of solder interconnects, a second integrated device coupled to the substrate through a second plurality of pillar interconnects and a second plurality of solder interconnects, and a means for wire interconnection coupled to the first integrated device and the second integrated device, wherein the means for wire interconnection is located over the cavity of the substrate.

Another example provides a method for fabricating a package. The method provides a substrate comprising a cavity. The method couples a first integrated device to the substrate through a first plurality of pillar interconnects and a first plurality of solder interconnects. The method couples a second integrated device to the substrate through a second plurality of pillar interconnects and a second plurality of solder interconnects. The method forms a plurality of wire bonds between the first integrated device and the second integrated device, where the plurality of wire bonds is located over the cavity of the substrate.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate comprising a cavity, a first integrated device coupled to the substrate through a first plurality of pillar interconnects and a first plurality of solder interconnects, a second integrated device coupled to the substrate through a second plurality of pillar interconnects and a second plurality of solder interconnects, and a plurality of wire bonds coupled to the first integrated device and the second integrated device, wherein the plurality of wire bonds is located over the cavity of the substrate. The first integrated device includes a first row of a plurality of pads and a second row of a plurality of pads. The second integrated device includes a first row of a plurality of pads and a second row of a plurality of pads. The plurality of wire bonds includes a first plurality of wire bonds coupled to (i) the first row of the plurality of pads of the first integrated device and (ii) the first row of the plurality of pads of the second integrated device. The plurality of wire bonds includes a second plurality of wire bonds coupled to (i) the second row of the plurality of pads of the first integrated device and (ii) the second row of the plurality of pads of the second integrated device. The use of the plurality of wire bonds helps provide higher density interconnection between the integrated devices. The plurality of wire bonds may help provide shorter and more direct electrical paths between integrated devices. The package may include an underfill and/or an encapsulation layer. The underfill and/or the encapsulation layer may help provide strong structural integrity for the integrated devices and the substrate, which in turn, helps provide a package that includes reliable interconnects between two or more integrated devices.

Exemplary Package Comprising Wire Bonds Between Integrated Devices

Figure 1:
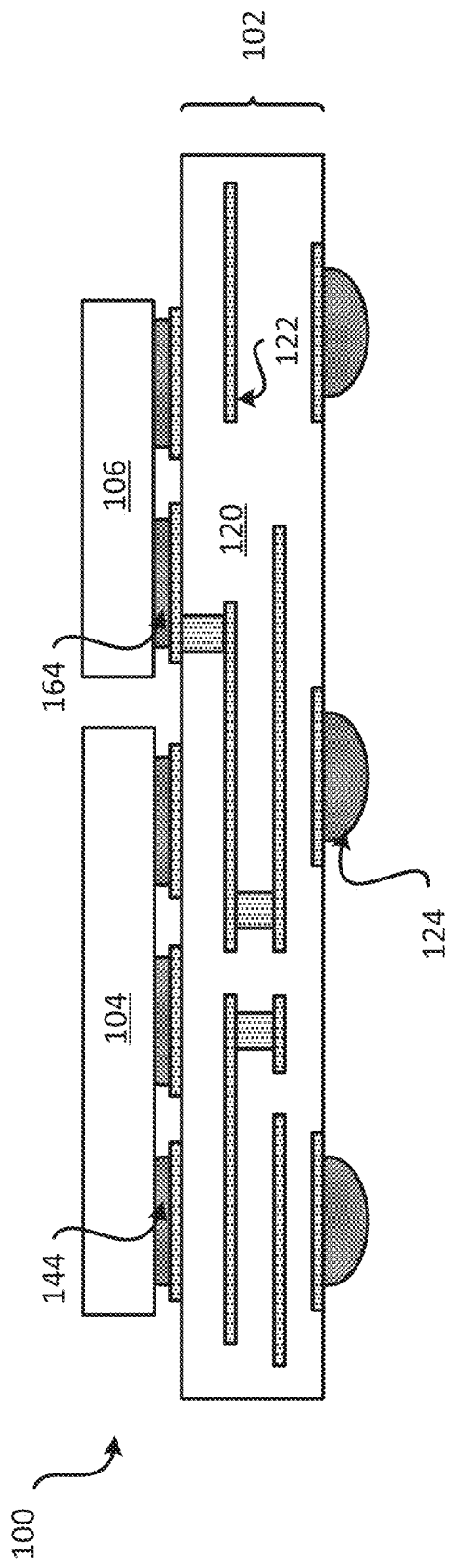
FIG. 1 illustrates a profile view of a package that includes an integrated device and a substrate.
Figure 2:
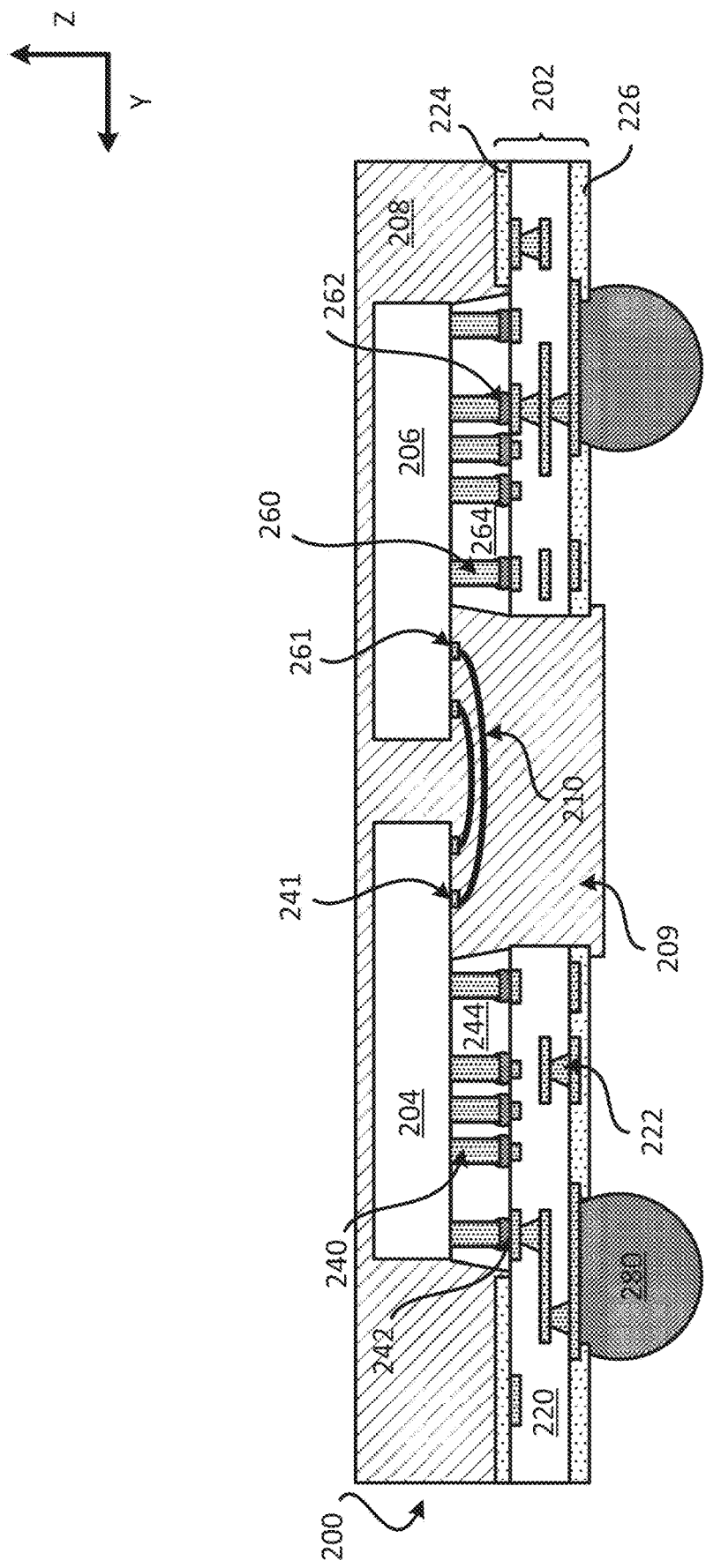
FIG. 2 illustrates a profile view of a package that includes wire bonds coupled to integrated devices.

FIG. 2 illustrates a profile view of a package 200 that includes a plurality of wire bonds between integrated devices. The package 200 may be coupled to a board (e.g., printed circuit board (PCB)) through a plurality of solder interconnects 280. The package 200 provides a package with a high-density interconnection between integrated devices.

As shown in FIG. 2, the package 200 includes a substrate 202, a first integrated device 204, a second integrated device 206, a plurality of wire bonds 210, an underfill 244, an underfill 264, and an encapsulation layer 208.

As will be further described below, the plurality of wire bonds 210 may be coupled to the integrated devices (e.g., 204, 206) in such a way that when at least one electrical signal (e.g., first electrical signal, second electrical signal) travels between at least two integrated devices (e.g., 204, 206), the electrical signal bypasses the substrate 202. However, the at least one electrical signal may travel through at least one electrical path that is defined by interconnects of the package, the integrated device(s), and/or the substrate.

The substrate 202 includes a first surface (e.g., top surface) and a second surface (e.g., bottom surface). The substrate 202 includes at least one dielectric layer 220, a plurality of interconnects 222, a first solder resist layer 224, and a second solder resist layer 226. The substrate 202 also includes a cavity 209 that extends through the substrate 202. The cavity 209 may extend through the at least one dielectric layer 220, the first solder resist layer 224 and the second solder resist layer 226. The cavity 209 may have any shape (e.g., rectangular, square). The substrate 202 may include more than one cavity 209. As will be further described below, the cavity 209 may be at least partially filled (e.g., completely filled) with the encapsulation layer 208 and/or other materials. In some implementations, the cavity 209 of the substrate 202 may be a region or void that is free of the dielectric layer 220 and/or the plurality of interconnects 222 of the substrate 202. The substrate 202 may be considered to have the cavity 209 even if the cavity 209 is subsequently filled with one or more materials. As will be further described below, the cavity 209 in the substrate 202 may allow the plurality of wire bonds 210 to be formed between the integrated devices (e.g., 204, 206). The plurality of wire bonds 210 may be located over the cavity 209 (e.g., above or below the cavity 209, depending on how above or below may be arbitrarily defined). In some implementations, the plurality of wire bonds 210 may be located at least partially in the cavity 209 of the substrate 202.

The plurality of interconnects 222 may be configured to provide at least one electrical path to and/or from a board. The plurality of interconnects 222 may be configured to provide at least one electrical path to at least one integrated device (e.g., 204, 206). The plurality of interconnects 222 may be configured to provide at least one electrical path (e.g., electrical connection) between two or more integrated devices (e.g., 204, 206). The plurality of interconnects 222 may have a first minimum pitch and a first minimum line and spacing (US). In some implementations, the first minimum line and spacing (L/S) for the plurality of interconnects 222 is in a range of approximately 9/9-12/12 micrometers (μm) (e.g., minimum line width of approximately 9-12 micrometers (μm), minimum spacing of approximately 9-12 micrometers (μm)). Different implementations may use different substrates. The substrate 202 may be a laminate substrate, a cureless substrate, an organic substrate, and/or a cored substrate (e.g., includes a core layer). In some implementations, the at least one dielectric layer 220 may include a core layer and/or prepreg layers. The at least one dielectric layer 220 may have a dielectric constant in a range of approximately 3.5-3.7. An example of fabricating a substrate is further described below in FIGS. 10A-10C. As will be further described below, in some implementations, the substrate 202 may be fabricated using a modified semi-additive process (mSAP) or a semi-additive process (SAP).

The first integrated device 204 is coupled to the first surface (e.g., top surface) of the substrate 202. In some implementations, the first integrated device 204 is coupled to the substrate 202 through a plurality of pillar interconnects 240 and/or a plurality of solder interconnects 242. The plurality of pillar interconnects 240 and/or the plurality of solder interconnects 242 may be coupled to the plurality of interconnects 222 of the substrate 202. The plurality of pillar interconnects 240 may help provide higher density interconnects between the first integrated device 204 and the substrate 202. The plurality of pillar interconnects 240 may be optional. Thus, the first integrated device 204 may be coupled to the substrate 202 through the plurality of solder interconnects 242. Part of the first integrated device 204 may be located over the cavity 209. A front side of the first integrated device 204 may face the substrate 202. The first integrated device 204 includes a plurality of pads 241. As will be further described below, the plurality of pads 241 may be arranged in rows of pads, comprising a first row of pads and a second row of pads. The first row of pads may be staggered relative to the second row of pads, and vice versa. It is noted that the plurality of pads 241 may include more than two rows of pads.

The second integrated device 206 is coupled to the first surface of the substrate 202. In some implementations, the second integrated device 206 is coupled to the substrate 202 through a plurality of pillar interconnects 260 and/or a plurality of solder interconnects 262. The plurality of pillar interconnects 260 and/or the plurality of solder interconnects 262 may be coupled to the plurality of interconnects 222. The plurality of pillar interconnects 260 may help provide higher density interconnects between the second integrated device 206 and the substrate 202. The plurality of pillar interconnects 260 may be optional. Thus, the second integrated device 206 may be coupled to the substrate 202 through the plurality of solder interconnects 262. Part of the second integrated device 206 may be located over the cavity 209. A front side of the second integrated device 206 may face the substrate 202. The second integrated device 206 includes a plurality of pads 261. As will be further described below, the plurality of pads 261 may be arranged in rows of pads, comprising a first row of pads and a second row of pads. The first row of pads may be staggered relative to the second row of pads, and vice versa. It is noted that the plurality of pads 261 may include more than two rows of pads.

The plurality of wire bonds 210 is coupled to the first integrated device 204 and the second integrated device 206. For example, the plurality of wire bonds 210 is coupled to (i) the plurality of pads 241 of the first integrated device 204, and (ii) the plurality of pads 261 of the second integrated device 206. In some implementations, each of the plurality of wire bonds 210 may have a diameter of at least 15 micrometers. The plurality of wire bonds 210 may have different heights and/or vertical offsets (e.g., different maximum heights and/or maximum vertical offsets) from the surface of integrated devices (e.g., 204, 206), the plurality of pads 241 and/or the plurality of pads 261. The use of the plurality of wire bonds 210 with different heights and/or vertical offsets allows for high-density interconnections between the first integrated device 204 and the second integrated device 206. In some implementations, the plurality of wire bonds 210 may have a density of at least 40 wire bonds per millimeter (e.g., 40 interconnections per millimeter) between the first integrated device 204 and the second integrated device 206. The number of interconnections per millimeter that is provided by the plurality of wire bonds 210 may be better than the number interconnects per millimeter that is provided in the substrate 202. This may be the case, despite the fact that one or more wire bonds from the plurality of wire bonds 210 has a minimum diameter of 15 micrometers, while interconnects in the substrate 202 may have first minimum line and spacing (L/S) in a range of approximately 9/9-12/12 micrometers (μm) (e.g., minimum line width of approximately 9-12 micrometers (μm), minimum spacing of approximately 9-12 micrometers (μm)). Thus, despite the wire bonds 210 having thicker dimensions, the use of the wire bonds having different heights and/or offsets, allows more interconnection per millimeter to be provided than interconnects in the substrate 202, Moreover, the plurality of wire bonds 210 provides a shorter and more direct electrical paths between the first integrated device 204 and the second integrated device 206. The shorter and more direct electrical paths between integrated devices may lead to better integrated devices and/or package performance. Examples of wire bonds 210 configurations and arrangements are further described below in at least FIGS. 4-6.

As shown in FIG. 2, the underfill 244 is located between the first integrated device 204 and the substrate 202. Similarly, the underfill 264 is located between the second integrated device 206 and the substrate 202. The underfill 244 may surround the plurality of pillar interconnects (e.g., 240) and/or the plurality of solder interconnects (e.g., 242). The underfill 264 may surround the plurality of pillar interconnects (e.g., 260) and/or the plurality of solder interconnects (e.g., 262). The underfills 244 and/or 264 may be located in other places, such as in the cavity 209 and/or over the first integrated device 204 and the second integrated device 206. The underfill 244 and the underfill 264 may be part of the same underfill or separate underfills.

The underfills 244 and/or 264 help provide structural stability to the package 200. In particular, the underfills 244 and/or 264 helps provide a strong and reliable mechanical coupling between the first integrated device 204, the second integrated device 206 and the substrate 202. By helping to keep the first integrated device 204 and the second integrated device 206 structurally together with the substrate 202, the underfills 244 and/or 264 help ensure that a strong and reliable electrical connection (e.g., electrical path) exist between the first integrated device 204 and the second integrated device 206.

Different implementations may provide the underfills 244 and/or 264 with different materials and/or properties. The underfills 244 and/or 264 may include one or more underfill (e.g., underfill layers). For example, the underfills 244 and/or 264 may be formed from a single formation of an underfill. In some implementations, the underfills 244 and/or 264 may represent several portions and/or layers of underfills that are formed and cured separately. In some implementations, the underfills 244 and/or 264 may include a viscosity of approximately 10-30 pascal second. (Pa·s).

These viscosity values may be for temperatures of about 80 degrees Celsius. In some implementations, the underfills 244 and/or 264 may include a coefficient of thermal expansion (CTE) of approximately 10-15 part per million (ppm). In some implementations, the underfills 244 and/or 264 may include a filler that represents approximately 50-90 percent of the weight of the underfills 244 and/or 264. As will be further described below, the underfills 244 and/or 264 may have capillary properties that allow the underfills 244 and/or 264 to fill small spaces between the integrated devices and/or the substrate. For example, the viscosity values described above for the underfills 244 and/or 264 allows the underfills 244 and/or 264 to travel and fill between the small spaces between the integrated devices and/or the substrate. The underfills 244 and/or 264 and/or other materials that may be located around the pillars and between the integrated device and a substrate are further described below.

The encapsulation layer 208 is located and formed over the substrate 202. The encapsulation layer 208 may include a mold, a resin, an epoxy and/or polymer. The encapsulation layer 208 may be a means for encapsulation. The encapsulation layer 208 may at least partially encapsulate the first integrated device 204 and/or the second integrated device 206. The encapsulation layer 208 may be located in the cavity 209 of the substrate 202. The encapsulation layer 208 may at least partially fill the cavity 209 of the substrate 202. It is noted that the substrate 202 may still be considered to have the cavity 209, even if all of the cavity 209 is filled with the encapsulation layer 208 and/or other materials. The encapsulation layer 208 may help provide structural stability to the package 200.

An integrated device (e.g., 204, 206) may include a die (e.g., semiconductor bare die). The integrated device may include a logic die, a radio frequency (RE) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, a power management processor (e.g., power management integrated circuit (PMIC)), and/or combinations thereof. An integrated device (e.g., 204, 206) may include at least one electronic circuit (e.g., first electronic circuit, second electronic circuit, etc. . . . ).

Figure 3:
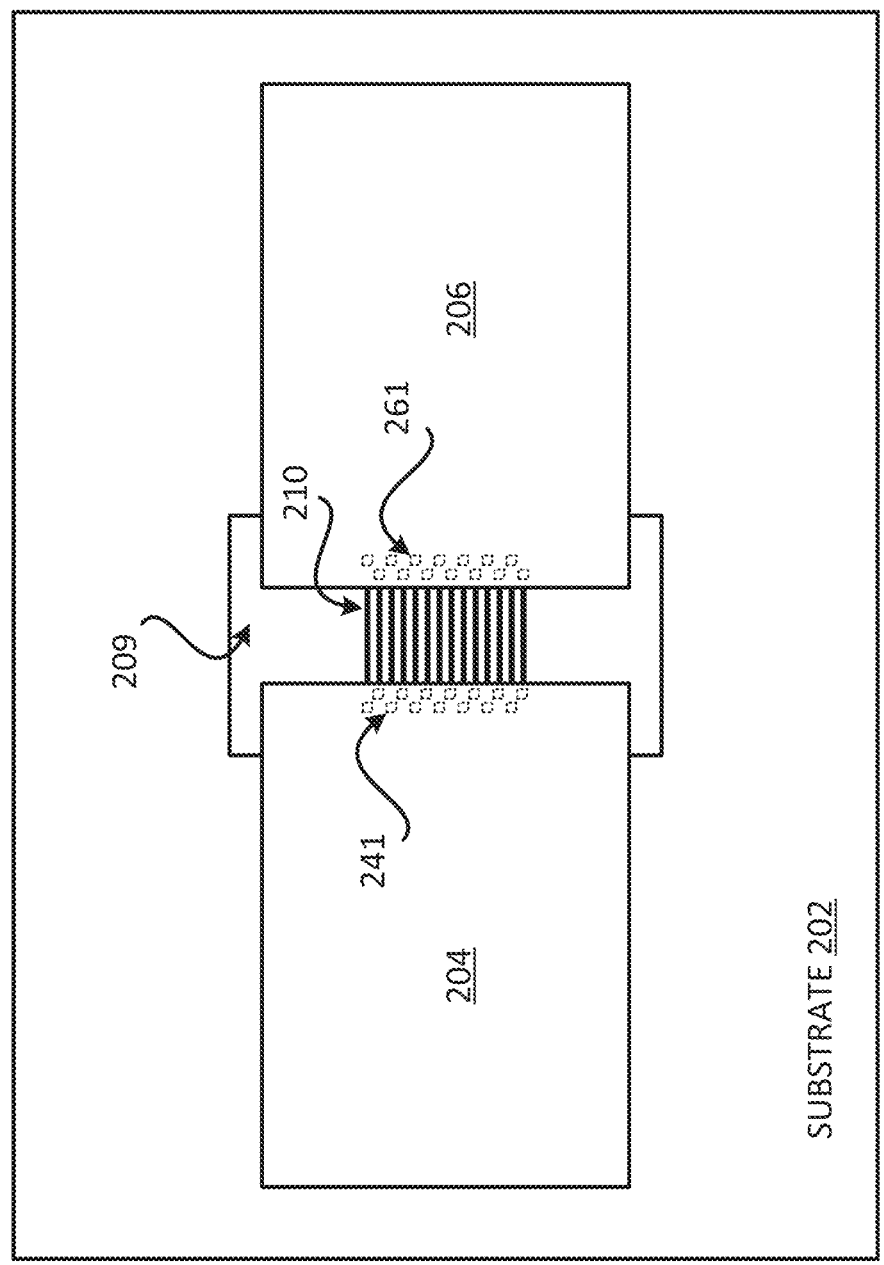
FIG. 3 illustrates a plan view of a package that includes wire bonds coupled to integrated devices.

FIG. 3 illustrates a plan view of the package 200 comprising a plurality of wire bonds between integrated devices. The package 200 includes the substrate 202, the cavity 209, the first integrated device 204, the second integrated device 206 and the plurality of wire bonds 210. The first integrated device 204 and the second integrated device 206 are coupled to the substrate 202. The plurality of wire bonds 210 is coupled to the first integrated device 204 and the second integrated device 206. The plurality of wire bonds 210 is located over the cavity 209 of the substrate 202. Part of the first integrated device 204 and/or part of the second integrated device 206 may be located over the cavity 209 of the substrate 202. As mentioned above, the cavity 209 may be at least partially filled with an encapsulation layer and/or other materials.

Figure 4:
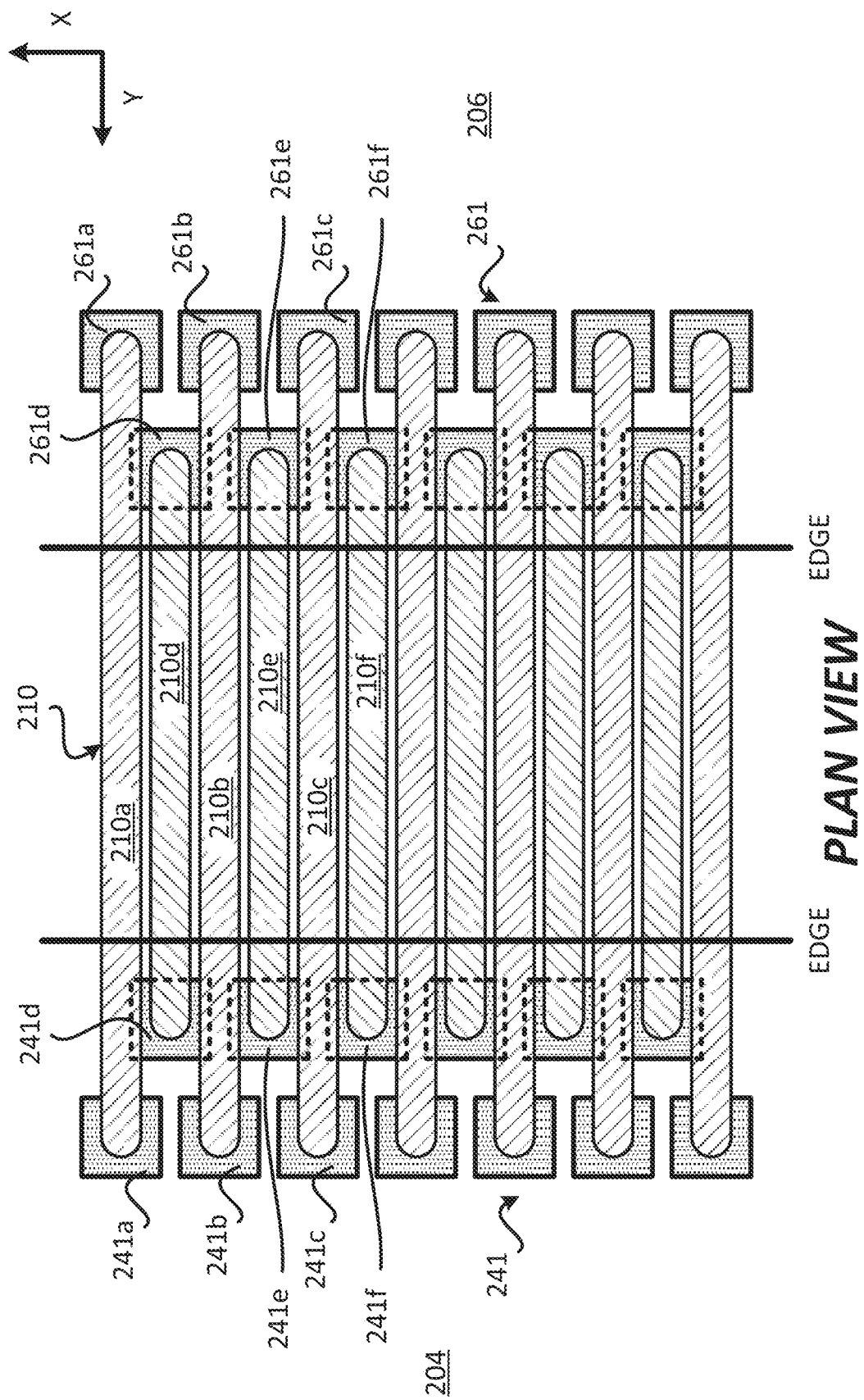
FIG. 4 illustrates a plan view of wire bonds coupled to integrated devices.

FIG. 4 illustrates a close-up plan view of a plurality of wire bonds coupled to pads of integrated devices. As shown in FIG. 4, the plurality of wire bonds 210 is coupled to the first integrated device 204 and the second integrated device 206. The plurality of wire bonds 210 includes a wire bond 210a, a wire bond 210b, a wire bond 210c, a wire bond 210d, a wire bond 210e and a wire bond 210f. The wire bond 210a, the wire bond 210b and the wire bond 210c may be part of a first plurality of wire bonds. The wire bond 210d, the wire bond 210e and the wire bond 210f may be part of a second plurality of wire bonds.

The first integrated device 204 includes a plurality of pads 241 that are arranged in rows of pads. The plurality of pads 241 includes a pad 241a, a pad 241b, a pad 241c, a pad 241d, a pad 241e, and a pad 241f. The pad 241a, the pad 241b and the pad 241c may be part of a first row of a plurality of pads for the first integrated device 204. The pad 241d, the pad 241e and the pad 241f may be part of a second row of a plurality of pads for the first integrated device 204. The second row of a plurality of pads may be staggered to the first row of a plurality of pads of the first integrated device 204, and vice versa. The first row of a plurality of pads may be an inner row of pads. The second row of a plurality of pads may be an outer row of pads.

The second integrated device 206 includes a plurality of pads 261 that are arranged in rows of pads. The plurality of pads 261 includes a pad 261a, a pad 261b, a pad 261c, a pad 261d, a pad 261e, and a pad 261f. The pad 261a, the pad 261b and the pad 261c may be part of a first row of a plurality of pads for the second integrated device 206. The pad 261d, the pad 261e and the pad 261f may be part of a second row of a plurality of pads for the second integrated device 206. The second row of a plurality of pads may be staggered to the first row of a plurality of pads of the second integrated device 206, and vice versa. The first row of a plurality of pads may be an inner row of pads. The second row of a plurality of pads may be an outer row of pads. An inner row of pads and an outer row of pads may be arbitrarily defined. For example, an outer row of pads may be a row of pads that is closer to an edge of the integrated device (e.g., edge of integrated device facing another integrated device) than an inner row of pads. An inner row of pads may be a row of pads that is closer to the center of the integrated device than the outer row of pads. In some implementations, an integrated device may include several inner rows of pads.

A first plurality of wire bonds (which includes the wire bond 210a, the wire bond 210b and the wire bond 210c) is coupled to (i) the first row of the plurality of pads (which includes the pad 241a, the pad 241b and the pad 241c) of the first integrated device 204 and (ii) the first row of the plurality of pads (which includes the pad 261a, the pad 261b and the pad 261c) of the second integrated device 206.

A second plurality of wire bonds (which includes the wire bond 210d, the wire bond 210e and the wire bond 210f) is coupled to (i) the second row of the plurality of pads (which includes the pad 241d, the pad 241e and the pad 241f) of the first integrated device 204 and (ii) the second row of the plurality of pads (which includes the pad 261d, the pad 261e and the pad 261f) of the second integrated device 206.

FIG. 4 illustrates two rows of pads for each of the integrated devices. However, different implementations may have different numbers of rows of pads that are coupled to a plurality of wire bonds. For example, the first integrated device 204 may include a third row of the plurality of pads that are staggered from the first row of the plurality of pads, and the second integrated device 206 may include a third row of the plurality of pads that are staggered from the first row of the plurality of pads. The third row of the plurality of pads of the first integrated device 204 and the third row of the plurality of pads of the second integrated device 206 may be coupled to a third plurality of wire bonds. The third plurality of wire bonds may have a different vertical offset than the first plurality of wire bonds and the second plurality of wire bonds.

As will be further illustrated and described below in at least FIG. 6, the first plurality of wire bonds may be vertically offset (e.g., maximum vertical offset) from a surface of the integrated device(s) differently than the vertical offset (e.g., maximum vertical offset) of the second plurality of wire bonds from the surface of the integrated device(s).

The configuration of the pads in staggered rows and the use of wire bonds with different vertical offsets helps provide high-density electrical connections between integrated devices. For example, the configuration shown in FIG. 4, illustrates a configuration that can accommodate at least 40 wire bonds per millimeter. The plurality of wire bonds 210 may have wire bonds with a minimum diameter of 15 micrometers. In some implementations, the configuration shown may accommodate at least 50 wire bonds per millimeter. In some implementations, the configuration shown may accommodate between 40-60 wire bonds per millimeter (e.g., 40, 41, . . . 59, 60 wire bonds per millimeter). The high-density electrical connection that is provided by the plurality of wire bonds 210 may help provide over 200 channels (e.g., electrical connections) for signal, power and ground between two integrated devices that each have a minimum length and/or a minimum width of about 4 millimeters.

Figure 5:
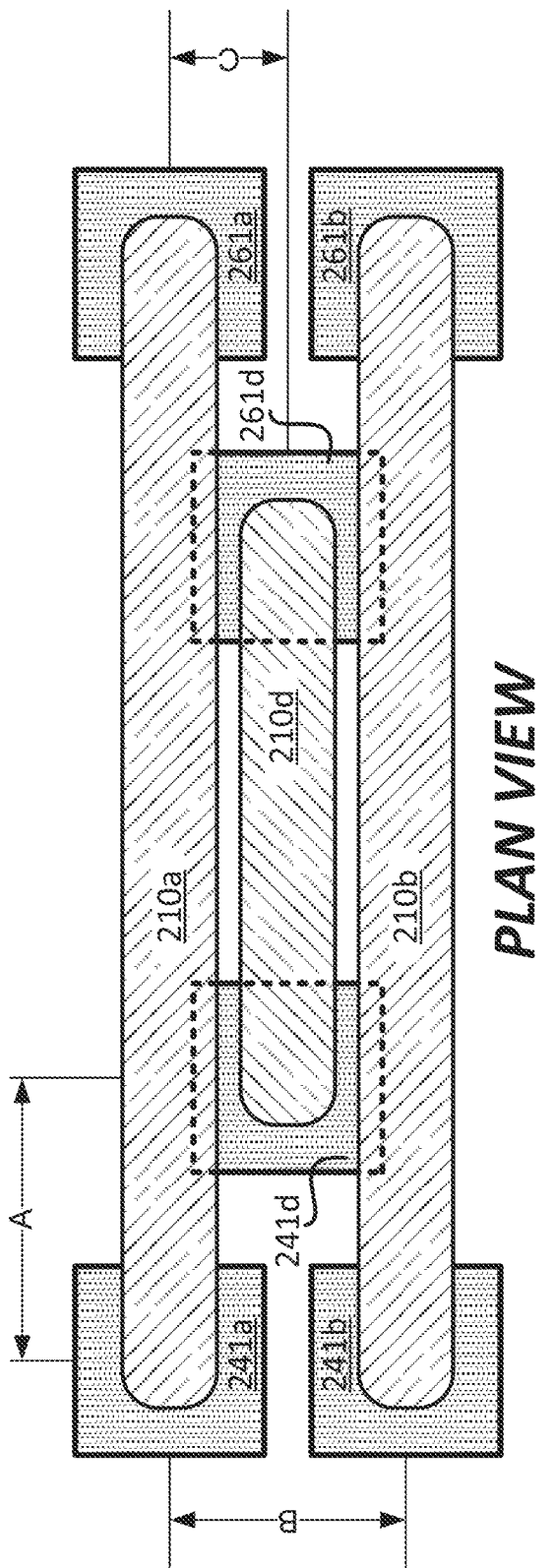
FIG. 5 illustrates a close-up plan view of wire bonds coupled to integrated devices.

FIG. 5 illustrates a plan view of how wire bonds are coupled to pads of integrated devices. FIG. 5 may be a close-up view of the wire bond connection shown in FIG. 4. The wire bond 210a is coupled to the pad 241a and the pad 261a. The wire bond 210b is coupled to the pad 241b and the pad 261b. The wire bond 210d is coupled to the pad 241d and the pad 261d. The wire bond 210a may be partially located over the pad 241d and the pad 261d. For example, the wire bond 210a may at least partially and vertically overlap with the pad 241d and the pad 261d. The wire bond 210b may be partially located over the pad 241d and the pad 261d. For example, the wire bond 210b may at least partially and vertically overlap with the pad 241d and the pad 261d.

In some implementations, the first row of pads and the second row of pads may have a center-to-center pitch (e.g., row to row pitch (A)) of approximately 61 micrometers. In some implementations, the first row of pads may have a center-to-center pitch (B) between pads (e.g., pad 241a and pad 241b) of approximately 40.5 micrometers. In some implementations, the second row of pads may have a center-to-center pitch (B) between pads (e.g., pad 241d and pad 241f) of approximately 40.5 micrometers. In some implementations, the staggered pitch (C) (e.g., center to center pitch between pad 241a and pad 241d) is approximately 20.25 micrometers. However, different implementations may use different dimensions for the various pitches.

Figure 6:
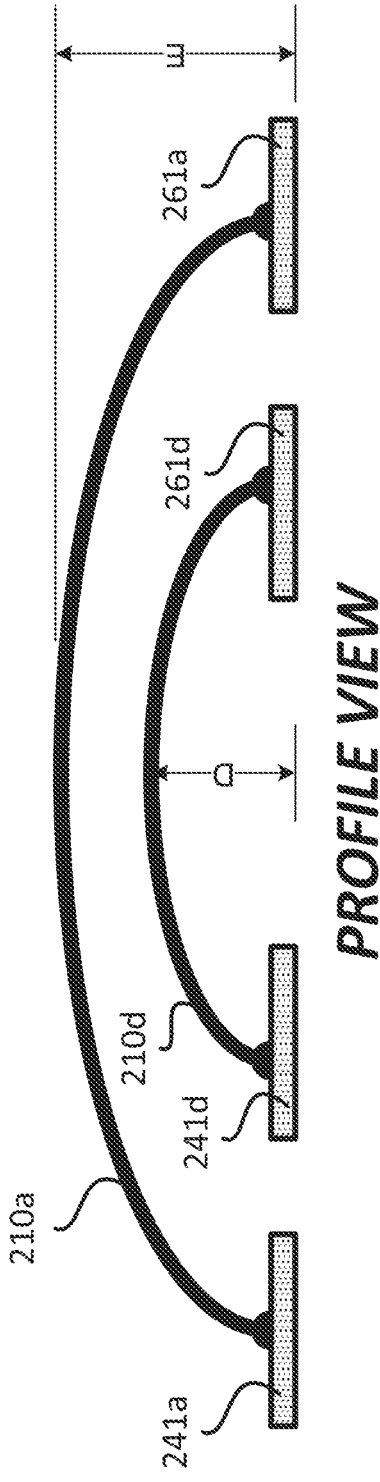
FIG. 6 illustrates a profile view of wire bonds coupled to integrated devices.

FIG. 6 illustrates a profile view of how wire bonds are coupled to pads of integrated devices. FIG. 6 illustrates that different wire bonds may be vertically offset (e.g., maximum vertical offset) from a surface of integrated devices differently. For example, the wire bond 210a may be vertically offset (E) (e.g., vertical distance, maximum vertical distance) from a surface of an integrated device (e.g., 204, 206) by approximately 55 micrometers. Other wire bonds from the plurality of wire bonds 210, such as the wire bond 210b and/or the wire bond 210c may be vertically offset by a similar height. In another example, the wire bond 210d may be vertically offset (I)) (e.g., vertical distance, maximum vertical distance) from a surface of an integrated device (e.g., 204, 206) by approximately 35 micrometers. Other wire bonds from the plurality of wire bonds 210, such as the wire bond 210e and/or the wire bond 210f may be vertically offset by a similar height. The wire bond 210*a* may be located at least partially over the wire bond 210*d*. The use of different vertical offsets for different sets of wire bonds helps provide high-density interconnection between integrated devices, by fitting more interconnection per millimeter between integrated devices.

Figure 7:
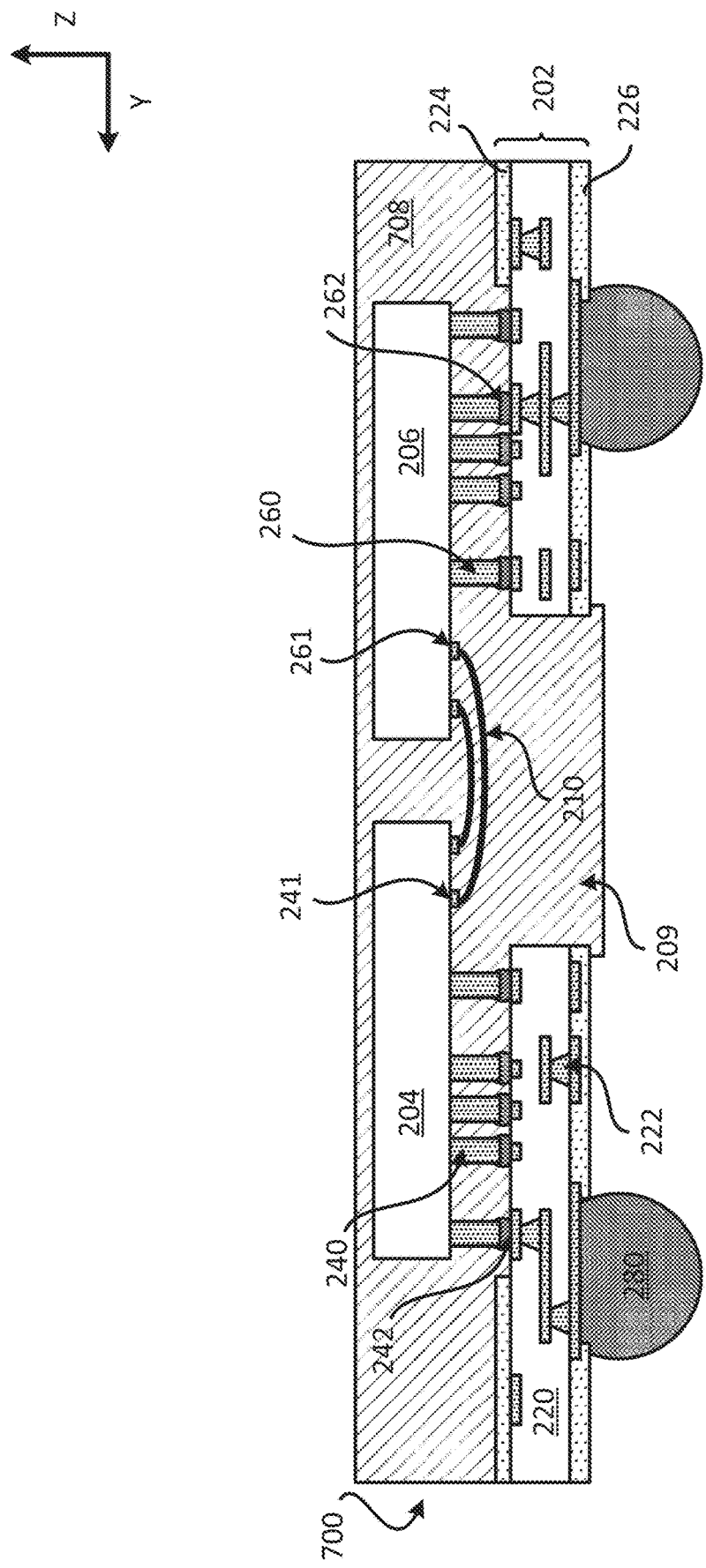
FIG. 7 illustrates a profile view of a package that includes wire bonds coupled to integrated devices.

FIG. 7 illustrates a package 700 that includes a plurality of wire bonds between integrated devices. The package 700 is similar to the package 200 of FIG. 2, and thus includes the same or similar components as the package 200. As shown in FIG. 7, the package 700 includes the substrate 202, the first integrated device 204, the second integrated device 206, the plurality of wire bonds 210 and an encapsulation layer 708. The encapsulation layer 708 may be the same, similar or different than the encapsulation layer 208. The encapsulation layer 708 may include a mold underfill (MUF). The encapsulation layer 708 may be located over the substrate 202 and in the cavity 209 of the substrate 202. The encapsulation layer 708 may encapsulate the first integrated device 204 and/or the second integrated device 206. The encapsulation layer 708 may encapsulate the plurality of pillar interconnects 240, the plurality of solder interconnects 242, the plurality of pillar interconnects 260, the plurality of solder interconnects 262 and/or the plurality of wire bonds 210.

It is noted that the number of wire bonds shown in FIGS. 2-7 is exemplary. Different implementations may have different numbers of wire bonds coupled to the integrated devices.

As mentioned above, the underfill 244, the underfill 264, the encapsulation layer 208 and/or the encapsulation layer 708, may have specific properties to ensure that the space around the pillar interconnects and the space between an integrated device and a substrate is properly filled to ensure a strong and secure bond between integrated devices and the substrate.

For example, the underfill (e.g., 244, 264) may include a capillary underfill that has good flowing ability. A capillary underfill (CUF) may include a polymer composite material of silica particle and epoxy liquid. One property of the capillary underfill is good flowing ability upon heating so it can flow into the narrow space between the integrated device and the substrate, which is driven by capillary force. The capillary underfill may have enough silica filler to get a final cured material with a low CTE. The capillary underfill may be a liquid type usually frozen under −40 degrees Celsius, and thawed and heated before application.

The encapsulation layer 208 may include an encapsulation material and/or epoxy mold compound (EMC) that is used to cover the whole package after capillary underfill application so it can protect the whole package. The encapsulation layer 208 may include solid pellet which can be stored at room temperature. The encapsulation layer 208 can be heated to liquid and process under the transfer molding flow to cover the integrated device.

In some implementations, a mold underfill (MU) may be used instead of or in conjunction with the underfill (e.g., 244, 264) and/or the encapsulation layer 208. A mold underfill may be a combination of a capillary underfill (e.g., underfill 244) and an EMC (e.g., encapsulation layer 208). The material properties and application format of the mold underfill are same or similar as regular EMC but with much finer filler size so it can be pressed into the integrated device to substrate gap during transfer molding process. By this way, the mold underfill can replace capillary underfill, and reduce the process steps.

The EMC and the METH can have much higher filler loading up to 90 weight (wt) % so the cured material properties is better than the capillary underfill with lower CTE and high modulus. In some implementations, if a package needs an encapsulation layer, the MUF may be used to replace the CUF. For package without an encapsulation layer, only the CUF may be used. Table 1 below illustrates exemplary properties of various materials, underfills and encapsulation layers. It is noted that the values for the materials are exemplary. Different materials may have different properties. Moreover, the values shown in the Table 1 are not limiting.

TABLE 1

Exemplary Properties of various materials, underfills and/or encapsulation layers.

|  | CAPILLARY UNDERFILL (CUF) | EPOXY MOLD COMPOUND (EMC) | MOLD UNDERFILL (MUF) | POLYIMIDE (PI) or PBO DIELECTRIC FILM |
|---|---|---|---|---|
| Filler loading | 50~70 wt % | Up to 90 wt % | Up to 90 wt % | 0% |
| Filler size | 0.1~3 um | Top cut up to 100 um | Top cut 20 um | N/A |
| Format before curing | Liquid | Solid | solid | liquid |
| Curing temp. | 150 C. | 180 C. | 180 C. | 250~390 C. |
| Cured material glass transition temp. | 120~150 C. | 150~160 C. | 150~160 C. | 250~320 C. |
| Cured material modulus | 5~10 GPa | 12~20 GPa | 12~20 GPa | 2~3 GPa |
| Cured material CTE | 20~30 ppm/C. | 1~5 ppm/C. | 1~5 ppm/C. | 30~80 ppm/C. |

It is noted that encapsulation layer 708 may be applicable to the package 200 of FIG. 2, or any package described in the disclosure. Similarly, it is noted that encapsulation layer 208 may be applicable to the package 700 of FIG. 7, or any package described in the disclosure. It is noted that the encapsulation layer (e.g., 208, 708) may be formed by one or more encapsulation layers. It is noted that each of the integrated devices may include additional electrical paths between each other and/or the substrate 202. It is noted that the paths of the electrical signals that may be shown and/or described in the disclosure are exemplary and/or conceptual. Different implementations may use different paths for the electrical signals. Moreover, electrical signals and/or electrical paths may travel through different types of interconnects (e.g., vias, traces, pads, pillars), solder interconnects and/or components (e.g., passive devices). Thus, for example, in some implementations, an electrical signal traveling between an integrated device and another integrated device may travel through at least one intervening component (e.g., passive device, capacitor) between the integrated devices. The paths shown and/or described for the electrical signals may also be applied to power and/or ground. It is also noted that more than one plurality of wire bonds may be used to facilitate the bypassing of the substrate. The plurality of wire bonds may be use to facilitate the electrical coupling between more than two integrated devices. For example, a first integrated device may be configured to be electrically coupled to a second integrated device through a first plurality of wire bonds. The first integrated device may be configured to be electrically coupled to a third integrated device through a second plurality of wire bonds. The terms "first surface" and "second surface" of a substrate are arbitrary, and may mean any surface of the substrate. For example, the first surface of the substrate may be a bottom surface of the substrate, and the second surface of the substrate may be a top surface of the substrate. In another example, the first surface of the substrate may be a top surface of the substrate, and the second surface of the substrate may be a bottom surface of the substrate.

Figure 8A:
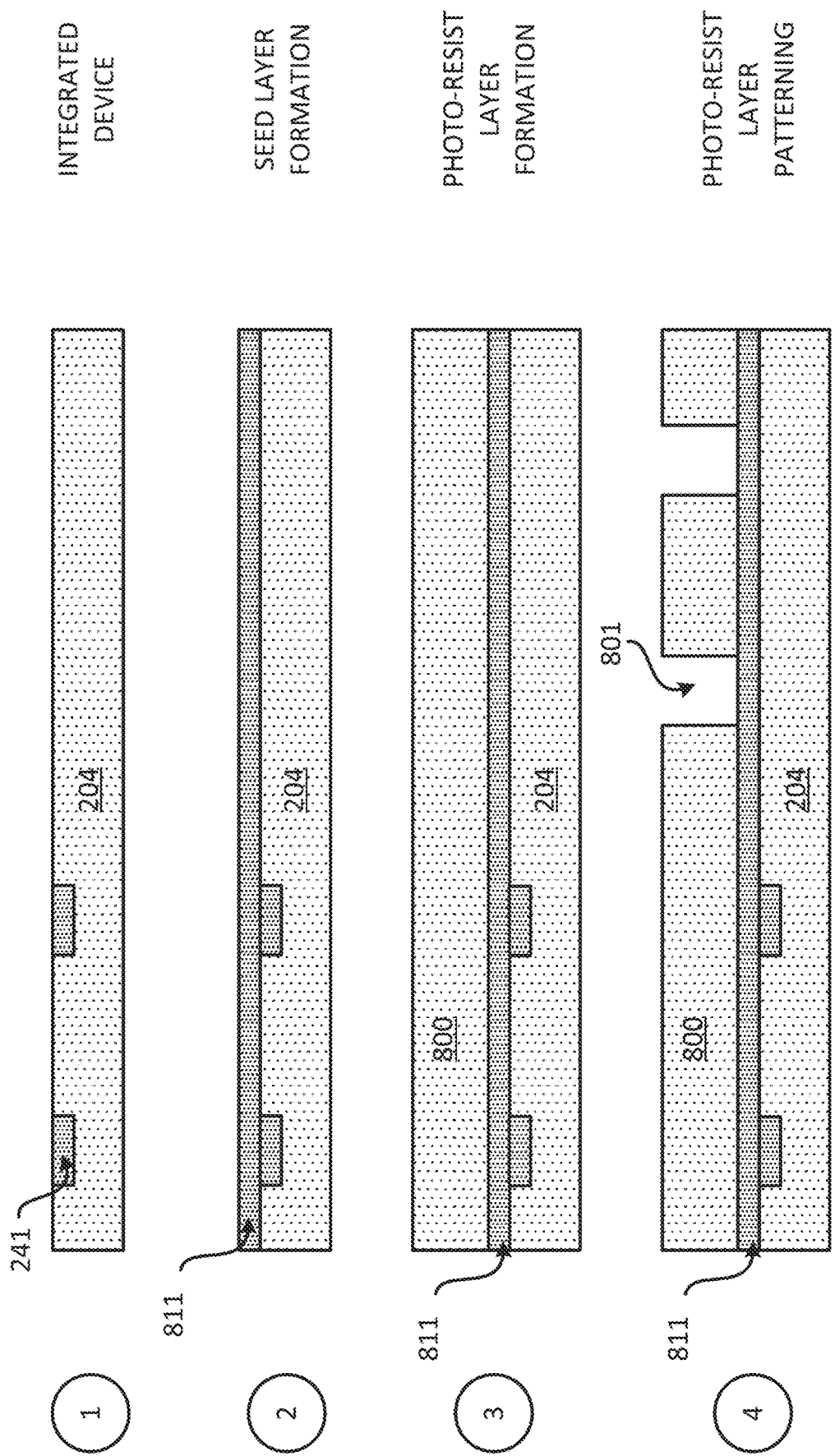
FIGS. 8A-8B illustrate an exemplary sequence for fabricating an integrated device with pillar interconnects.
Figure 8B:
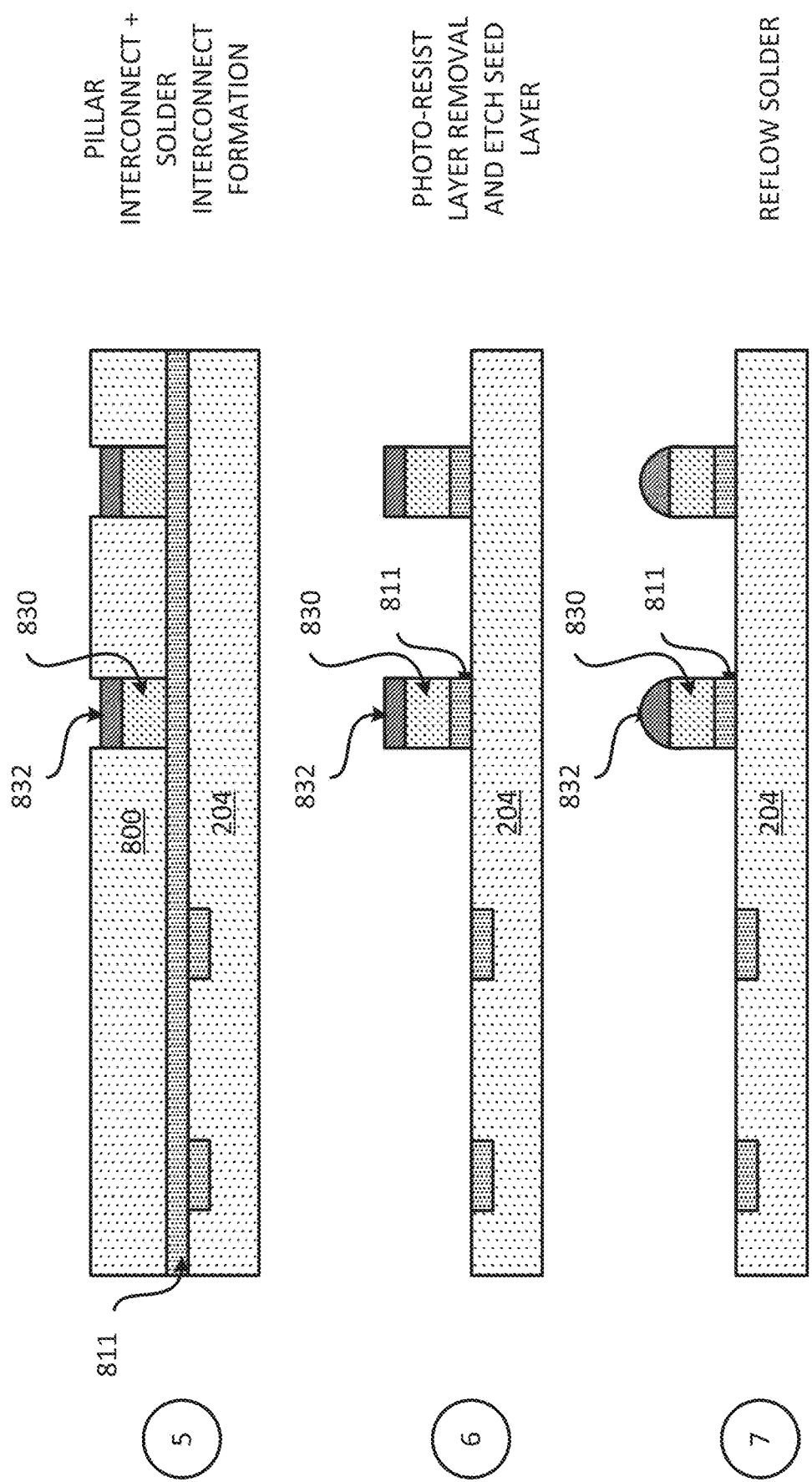

Exemplary Sequence for Fabricating an Integrated Device with Pillar Interconnects FIGS. 8A-8B illustrate an exemplary sequence for providing or fabricating an integrated device with pillar interconnects. In some implementations, the sequence of FIGS. 8A-8B may be used to provide or fabricate the integrated devices (e.g., 204, 206) of FIG. 2, or any of the integrated devices described in the disclosure.

It should be noted that the sequence of FIGS. 8A-8B may combine one or more stages in order to simplify and/or clarify the sequence for providing or fabricating the integrated device. In some implementations, the order of the processes may be changed or modified. In some implementations, one or more of processes may be replaced or substituted without departing from the scope of the disclosure. Different implementations may fabricate an integrated device differently.

Stage 1, as shown in FIG. 8A, illustrates a state after an integrated device 204 is provided. The integrated device 204 may include a die (e.g., bare semiconductor die). The integrated device 204 may include a substrate (e.g., silicon substrate) and a plurality of transistors (e.g., active devices). The integrated device 204 may include a plurality of pads 241.

Stage 2 illustrates a state after a seed layer 811 is formed over the front side of the integrated device 204. The seed layer 811 may include a metal layer. The seed layer 811 may be deposited over the integrated device 204. A plating process may be used to form the seed layer 811.

Stage 3 illustrates a state after a photo-resist layer 800 is formed over the seed layer 811. The photo-resist layer 800 may be deposited over the seed layer 811.

Stage 4 illustrates a state after the photo-resist layer 800 is patterned, creating at least one opening 801 in the photo resist layer 800 that exposes part of the seed layer 811.

Stage 5, as shown in FIG. 8B, illustrates a state after a plurality of pillar interconnects 830 and a plurality of solder interconnects 832 are formed over the seed layer 811, through openings 801 in the photo-resist layer 800. The plurality of pillar interconnects 830 may be formed over the seed layer 811 through a plating process. The plurality of solder interconnects 832 may be formed over the plurality of pillar interconnects 830 through a deposition process.

Stage 6 illustrates a state after the photo-resist layer 800 is removed, and part of the seed layer 811 is removed (e.g., etched). Removing the photo-resist layer 800 may include stripping the photo-resist layer 800.

Stage 7 illustrates a state after a reflow solder process that couples (e.g., bonds) the plurality of solder interconnects 832 to the plurality of pillar interconnects 830. Stage 7 may illustrate an integrated device (e.g., 204, 206) with pillar interconnects that may be coupled to a substrate. The plurality of pillar interconnects 830 may represent the plurality of pillar interconnects 240. The plurality of solder interconnects 832 may represent the plurality of solder interconnects 242. The seed layer 811 may be considered part of the pillar interconnect 830.

Figure 9:
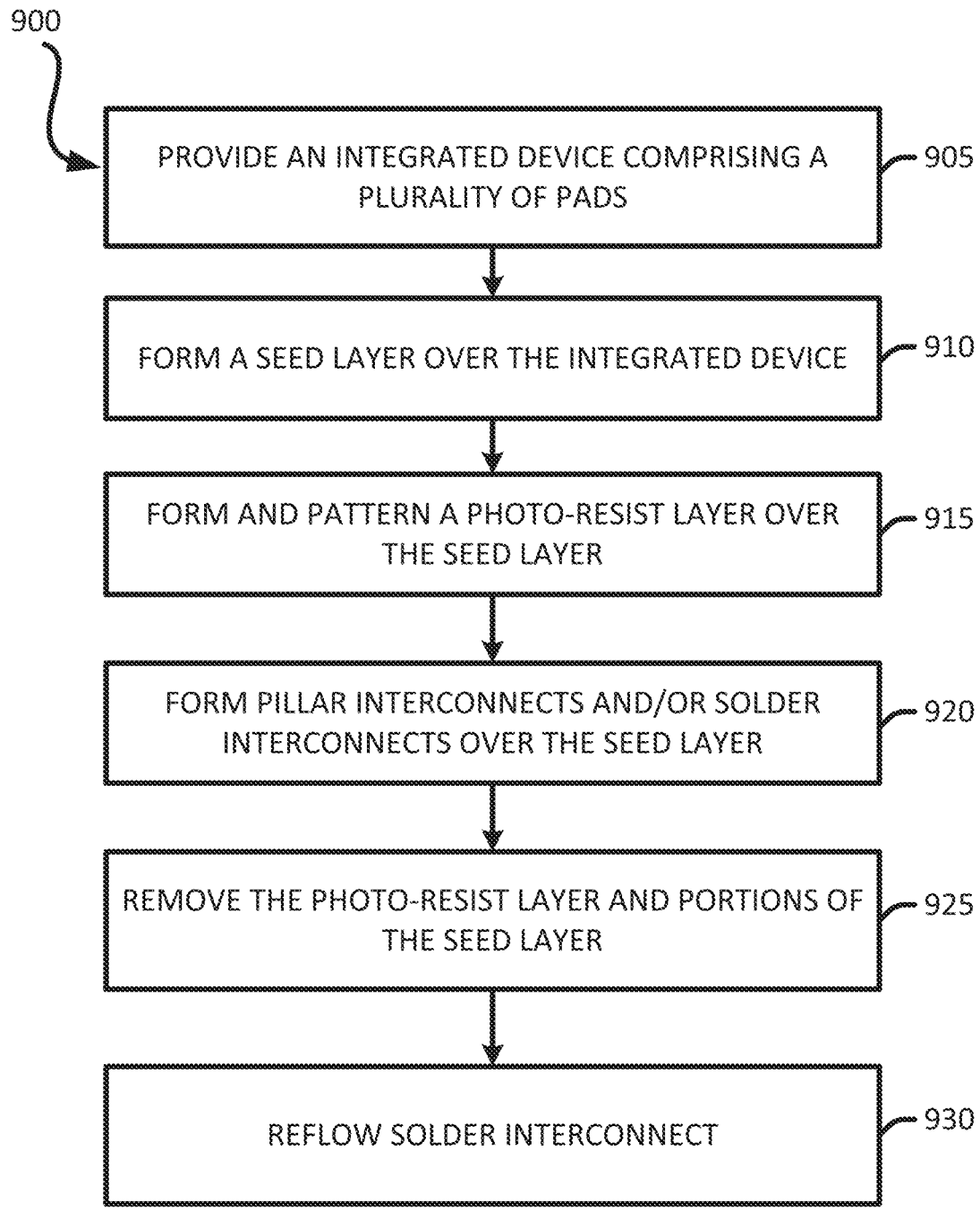
FIG. 9 illustrates an exemplary flow diagram of a method for fabricating an integrated device with pillar interconnects.

Exemplary Flow Diagram of a Method for Fabricating an Integrated Device Comprising Pillar Interconnects In some implementations, fabricating an integrated device with pillar interconnects includes several processes. FIG. 9 illustrates an exemplary flow diagram of a method 900 for providing or fabricating an integrated device with pillar interconnects. In some implementations, the method 900 of FIG. 9 may be used to provide or fabricate the integrated device (e.g., 204, 206) of FIG. 2 described in the disclosure. However, the method 900 may be used to provide or fabricate any of integrated devices and/or integrated device described in the disclosure.

It should be noted that the method of FIG. 9 may combine one or more processes in order to simplify and/or clarify the method for providing or fabricating an integrated device with pillar interconnects. In some implementations, the order of the processes may be changed or modified.

The method provides (at 905) an integrated device (e.g., 204, 206). Stage 1 of FIG. 8A illustrates and describes a first integrated device 204 that is provided. The first integrated device 204 may include a die with active devices, such as transistors. The integrated device may include a plurality of pads.

The method forms (at 910) a seed layer (e.g., 811) over a front side of the integrated device. The seed layer 811 may include a metal layer. The seed layer 811 may be deposited over the integrated device 204. A plating process may be used to form the seed layer 811. Stage 2 of FIG. 8A illustrates and describes an example of forming a seed layer.

The method forms (at 915) a photo-resist layer (e.g., 800) over the seed layer (e.g., 811). The photo-resist layer 800 may be formed and patterned over the seed layer 811. The photo-resist layer 800 may be deposited over the seed layer 811 and patterned, creating at least one opening 801 in the photo-resist layer 800 that exposes part of the seed layer 811. Stages 3-4 of FIG. 8A illustrate and describe an example of forming and patterning a photo-resist layer over a seed layer.

The method forms (at 920) a plurality of pillar interconnects (e.g., 830) and/or solder interconnects (e.g., 832) over the seed layer (e.g., 811) through openings 801 in the photo-resist layer (e.g., 800). The plurality of solder interconnects may be formed over the seed layer through a deposition process. The plurality of pillar interconnects may be formed over the seed layer through a plating process. The plurality of solder interconnects may be formed over the plurality of pillar interconnects through a deposition process. Stage 5 of FIG. 8B illustrates and describes an example of forming a plurality of pillar interconnects and/or a plurality of solder interconnects.

The method removes (at 925) a photo-resist layer (e.g., 800). Removing the photo-resist layer may include stripping the photo-resist layer. Stage 6 of FIG. 8B illustrate examples of removing a photo-resist layer. In some implementations, portions of a seed layer 811 may also be removed (at 925). An etching process may be used to remove portions of the seed layer. Stage 6 of FIG. 8B illustrates and describes an example of a portion of a seed layer that is removed. It is noted that forming a photo-resist layer, pillar interconnects and/or solder interconnects and removing the photo-resist layer, as described at 915, 920, and 925, may be repeated.

The method performs (at 930) a reflow solder process that couples (e.g., bonds) the plurality of solder interconnects (e.g., 832) to the plurality of pillar interconnects (e.g., 830). Stage 7 of FIG. 8B illustrates and describes an example of a reflow solder process.

In some implementations, the integrated device is part of a wafer, and singulation may be performed to cut the wafer into individual integrated devices. The method 900 may be used to fabricate any integrated device described in the disclosure.

Exemplary Sequence for Fabricating a Substrate

Figure 10A:
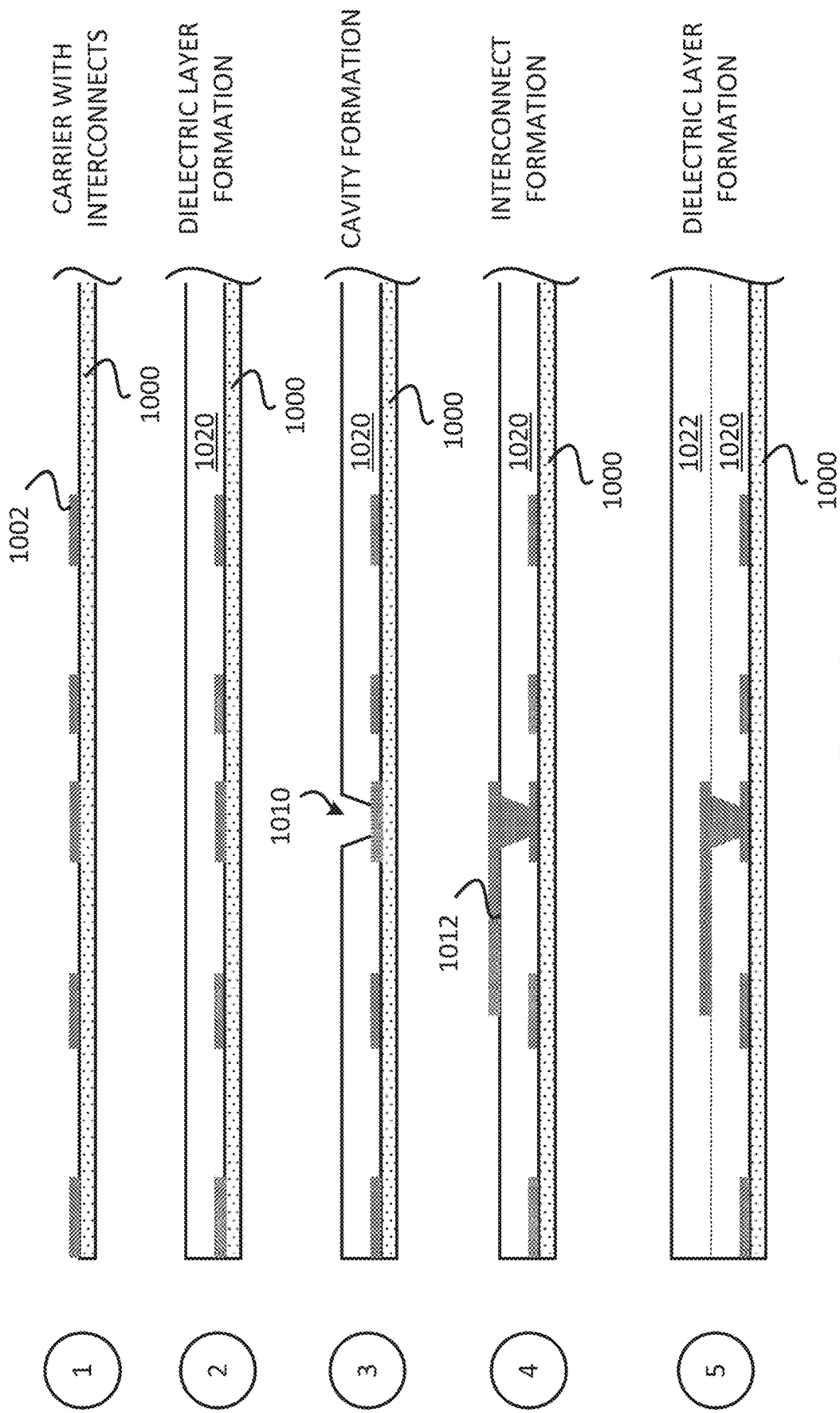
FIGS. 10A-10C illustrate an exemplary sequence for fabricating a substrate.
Figure 10B:
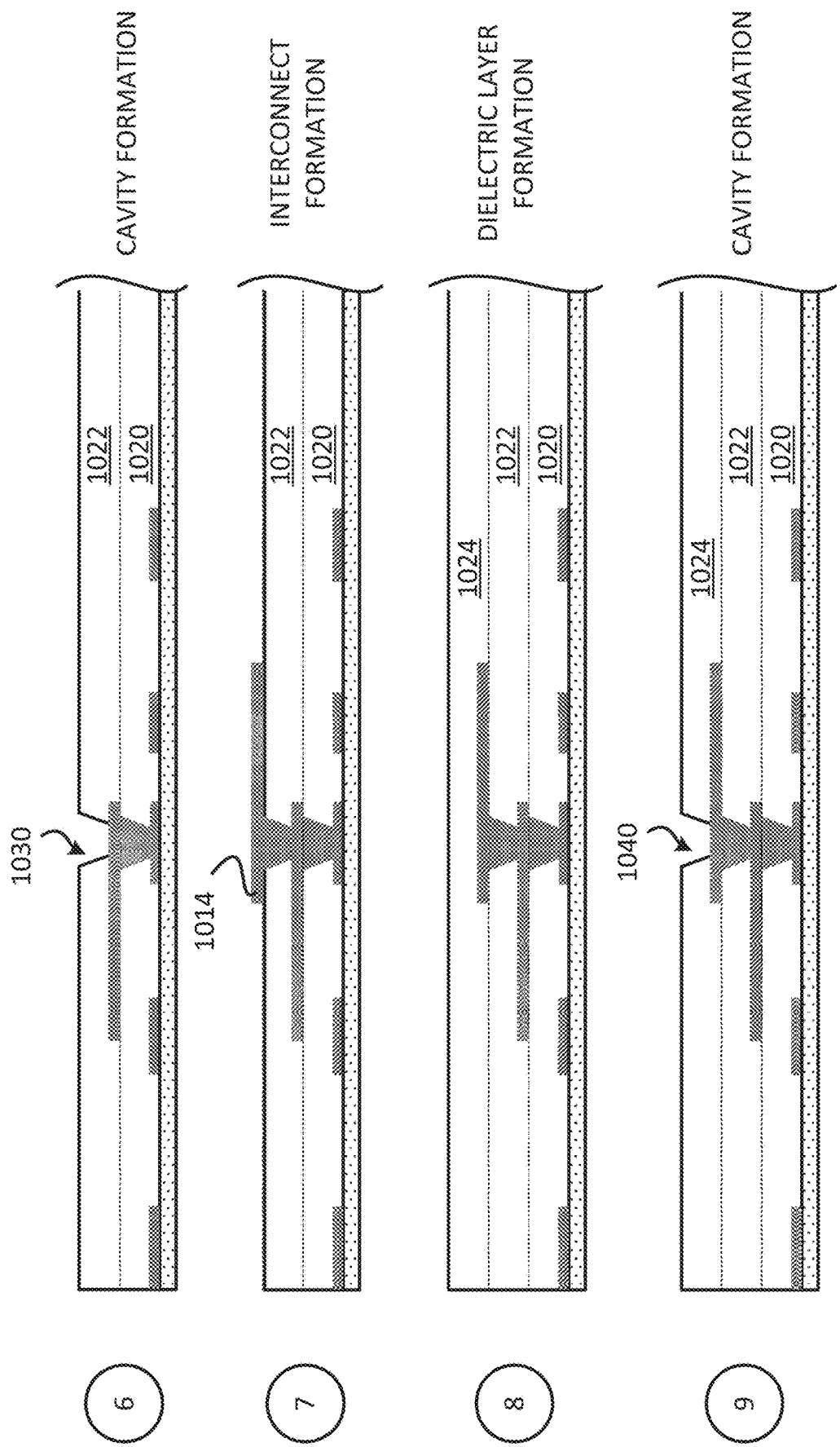
Figure 10C:
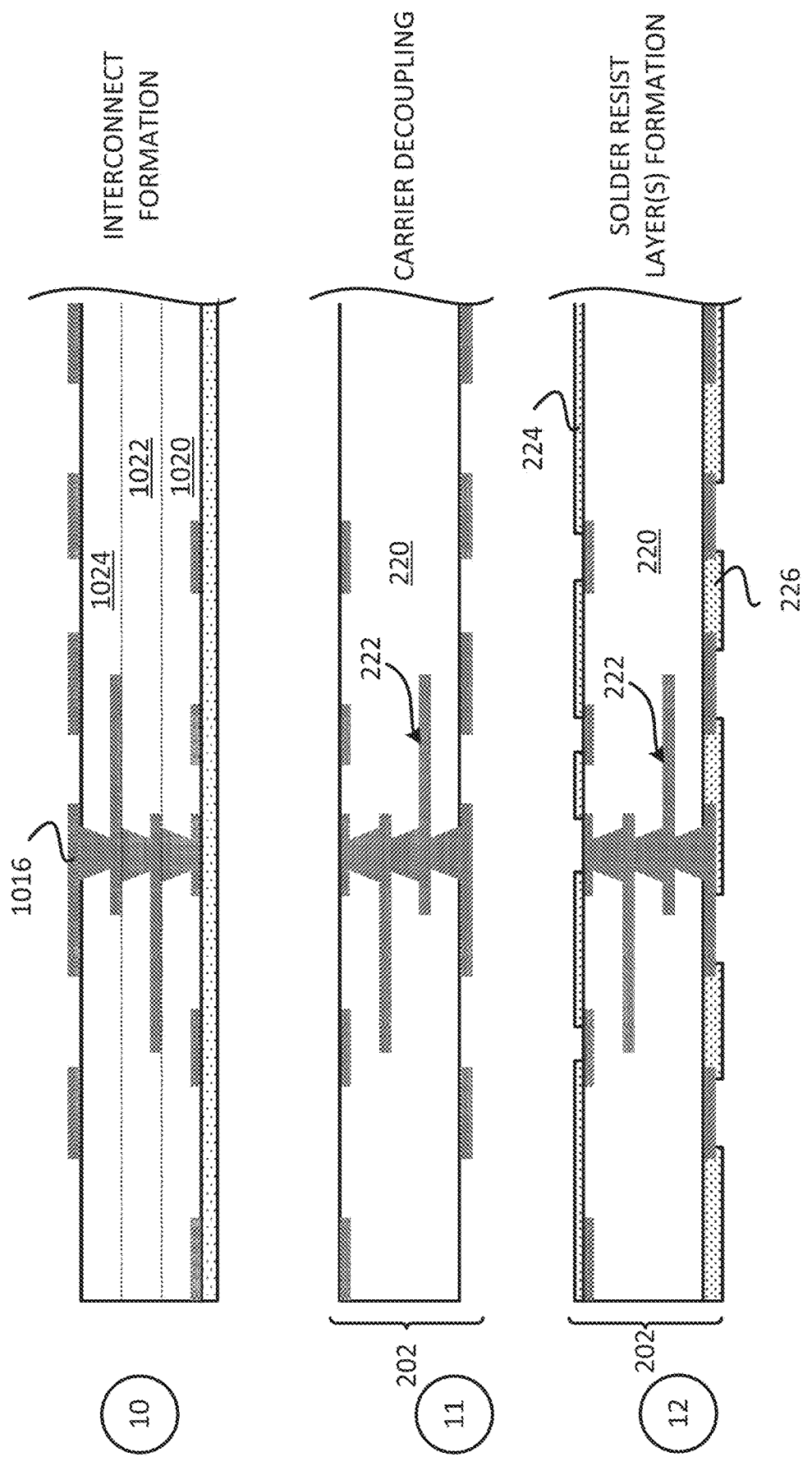

In some implementations, fabricating a substrate includes several processes, FIGS. 10A-10C illustrate an exemplary sequence for providing or fabricating a substrate. In some implementations, the sequence of FIGS. 10A-10C may be used to provide or fabricate the substrate 202 of FIG. 2. However, the process of FIGS. 10A-10C may be used to fabricate any of the substrates described in the disclosure.

It should be noted that the sequence of FIGS. 10A-10C may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 10A, illustrates a state after a carrier 1000 is provided and a metal layer is formed over the carrier 1000. The metal layer may be patterned to form interconnects 1002. A plating process and etching process may be used to form the metal layer and interconnects.

Stage 2 illustrates a state after a dielectric layer 1020 is formed over the carrier 1000 and the interconnects 1002. The dielectric layer 1020 may include polyimide. However, different implementations may use different materials for the dielectric layer.

Stage 3 illustrates a state after a plurality of cavities 1010 is formed in the dielectric layer 1020. The plurality of cavities 1010 may be formed using an etching process (e.g., photo etching process) or laser process.

Stage 4 illustrates a state after interconnects 1012 are formed in and over the dielectric layer 1020, including in and over the plurality of cavities 1010. For example, a via, pad and/or traces may be formed. A plating process may be used to form the interconnects.

Stage 5 illustrates a state after another dielectric layer 1022 is formed over the dielectric layer 1020. The dielectric layer 1022 may be the same material as the dielectric layer 1020. However, different implementations may use different materials for the dielectric layer.

Stage 6, as shown in FIG. 10B, illustrates a state after a plurality of cavities 1030 is formed in the dielectric layer 1022. An etching process or laser process may be used to form the cavities 1030.

Stage 7 illustrates a state after interconnects 1014 are formed in and over the dielectric layer 1022, including in and over the plurality of cavities 1030. For example, via, pad and/or trace may be formed. A plating process may be used to form the interconnects.

Stage 8 illustrates a state after another dielectric layer 1024 is formed over the dielectric layer 1022. The dielectric layer 1024 may be the same material as the dielectric layer 1020. However, different implementations may use different materials for the dielectric layer.

Stage 9 illustrates a state after a plurality of cavities 1040 is formed in the dielectric layer 1024. An etching process or laser process may be used to form the cavities 1040.

Stage 10, as shown in FIG. 10C, illustrates a state after interconnects 1016 are formed in and over the dielectric layer 1024, including in and over the plurality of cavities 1040. For example, via, pad and/or trace may be formed. A plating process may be used to form the interconnects.

Some or all of the interconnects 1002, 1012, 1014 and/or 1016 may define the plurality of interconnects 222 of the substrate 202. The dielectric layers 1020, 1022, 1024 may be represented by the at least one dielectric layer 220.

Stage 11 illustrates a state after the carrier 1000 is decoupled (e.g., removed, grinded out) from the dielectric layer 220, leaving the substrate 202 that includes the at least one dielectric layer 220 and the plurality of interconnects 222.

Stage 12 illustrates a state after the first solder resist layer 224 and the second solder resist layer 226 are formed over the substrate 202. A deposition process may be used to form the first solder resist layer 224 and the second solder resist layer 226.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 11:
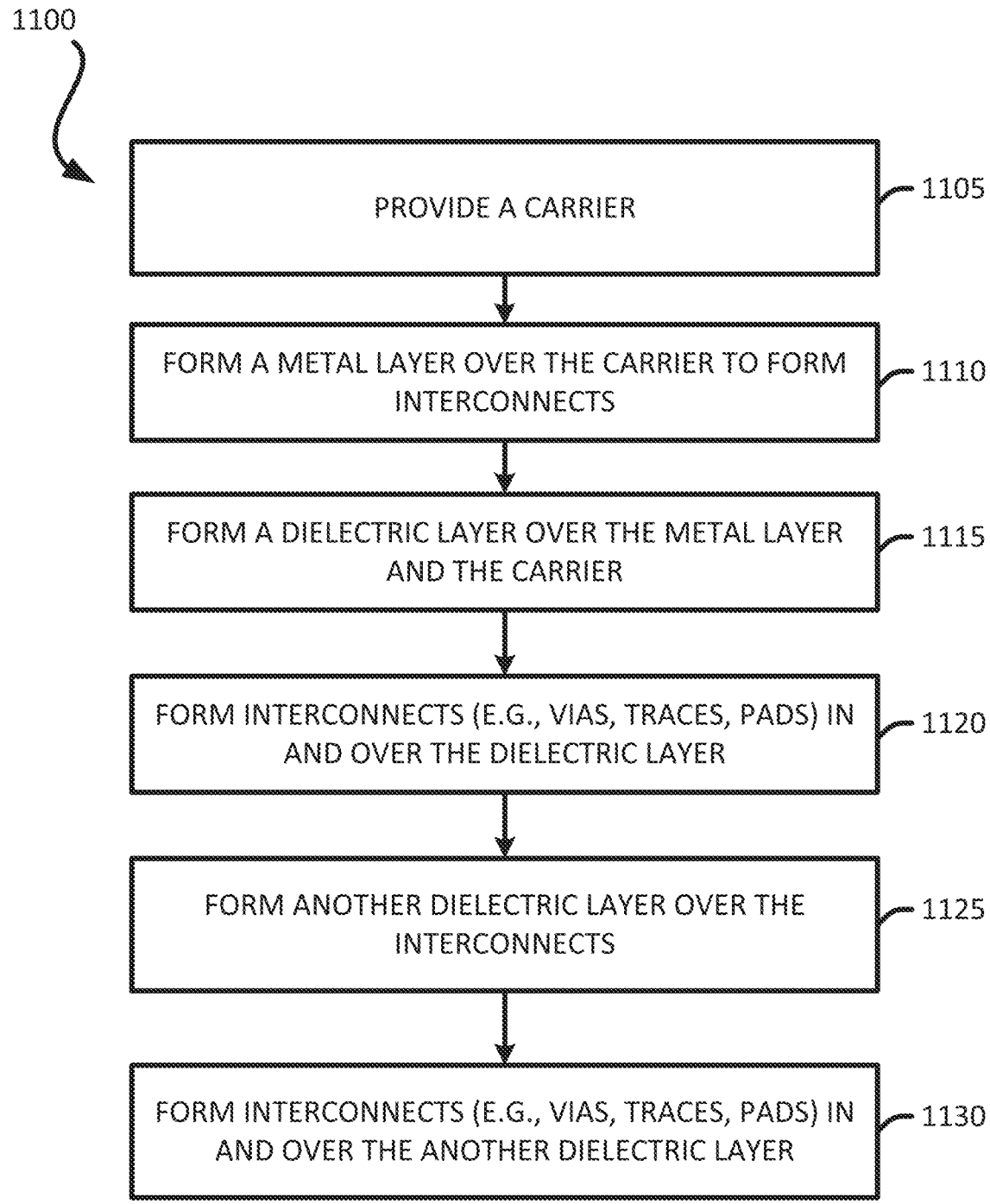
FIG. 11 illustrates an exemplary flow diagram of a method for fabricating a substrate.

In some implementations fabricating a substrate includes several processes. FIG. 11 illustrates an exemplary flow diagram of a method 1100 for providing or fabricating a substrate. In some implementations, the method 1100 of FIG. 11 may be used to provide or fabricate the substrate of FIG. 2. For example, the method of FIG. 11 may be used to fabricate the substrate 202.

It should be noted that the method of FIG. 11 may combine one or more processes in order to simplify and/or clarify the method for providing or fabricating a substrate. In some implementations, the order of the processes may be changed or modified.

The method provides (at 1105) a carrier 1000. Different implementations may use different materials for the carrier. The carrier may include a substrate, glass, quartz and/or carrier tape. Stage 1 of FIG. 10A illustrates and describes an example of a carrier that is provided.

The method forms (at 1110) a metal layer over the carrier 1000. The metal layer may be patterned to form interconnects. A plating process may be used to form the metal layer and interconnects. In some implementations, the carrier may include a metal layer. The metal layer over the carrier may be patterned to form interconnects (e.g., 1002). Stage 1 of FIG. 10A illustrates and describes an example of a metal layer and interconnects that are formed over a carrier.

The method firms (at 1115) a dielectric layer 1020 over the carrier 1000 and the interconnects 1002. The dielectric layer 1020 may include polyimide. Forming the dielectric layer may also include forming a plurality of cavities (e.g., 1010) in the dielectric layer 1020. The plurality of cavities may be formed using an etching process (e.g., photo etching)

or laser process. Stages 2-3 of FIG. 10A illustrate and describe an example of forming a dielectric layer and cavities in the dielectric layer.

The method forms (at 1120) interconnects in and over the dielectric layer. For example, the interconnects 1012 may be formed in and over the dielectric layer 1020. A plating process may be used to form the interconnects. Forming interconnects may include providing a patterned metal layer over and/or in the dielectric layer. Forming interconnects may also include forming interconnects in cavities of the dielectric layer. Stage 4 of FIG. 10A illustrates and describes an example of forming interconnects in and over a dielectric layer.

The method forms (at 1125) a dielectric layer 1022 over the dielectric layer 1020 and the interconnects. The dielectric layer 1022 may include polyimide. Forming the dielectric layer may also include forming a plurality of cavities (e.g., 1030) in the dielectric layer 1022. The plurality of cavities may be formed using an etching process or laser process. Stages 5-6 of FIGS. 10A-101 illustrate and describe an example of forming a dielectric layer and cavities in the dielectric layer.

The method forms (at 1130) interconnects in and/or over the dielectric layer. For example, the interconnects 1014 may be formed. A plating process may be used to form the interconnects. Forming interconnects may include providing a patterned metal layer over an in the dielectric layer. Forming interconnects may also include forming interconnects in cavities of the dielectric layer. Stage 7 of FIG. 10B illustrates and describes an example of forming interconnects in and over a dielectric layer.

The method may form additional dielectric layer(s) and additional interconnects as described at 1125 and 1130. Stages 8-10 of FIGS. 10B-10C illustrate an example of forming interconnects in and over a dielectric layer.

Once all the dielectric layer(s) and additional interconnects are formed, the method may decouple (e.g., remove, grind out) the carrier (e.g., 1000) from the dielectric layer 1020, leaving the substrate. In some implementations, the method may form solder resist layers (e.g., 224, 226) over the substrate.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 12A:
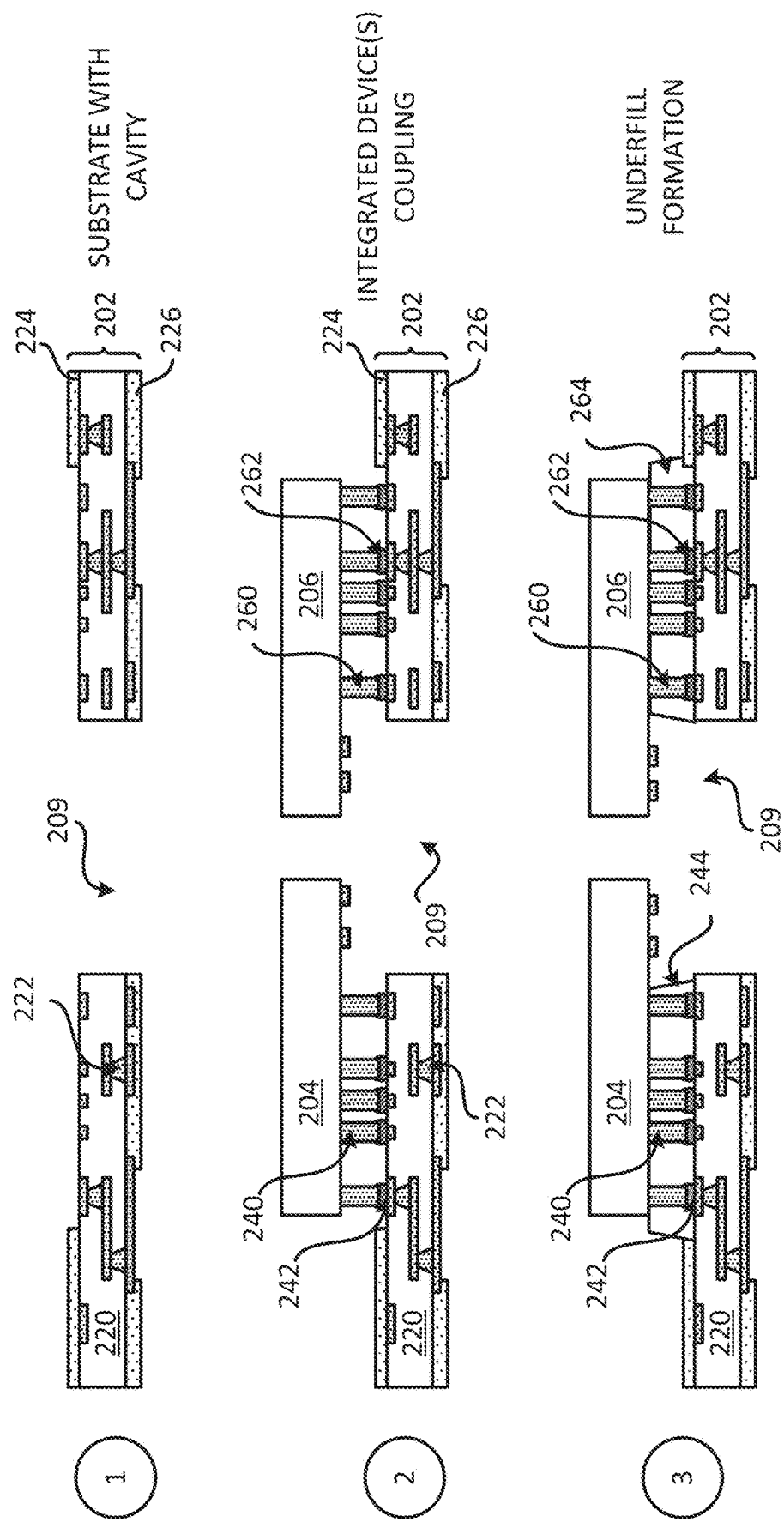
FIGS. 12A-12B illustrate an exemplary sequence for fabricating a package that includes wire bonds coupled to integrated devices.
Figure 12B:
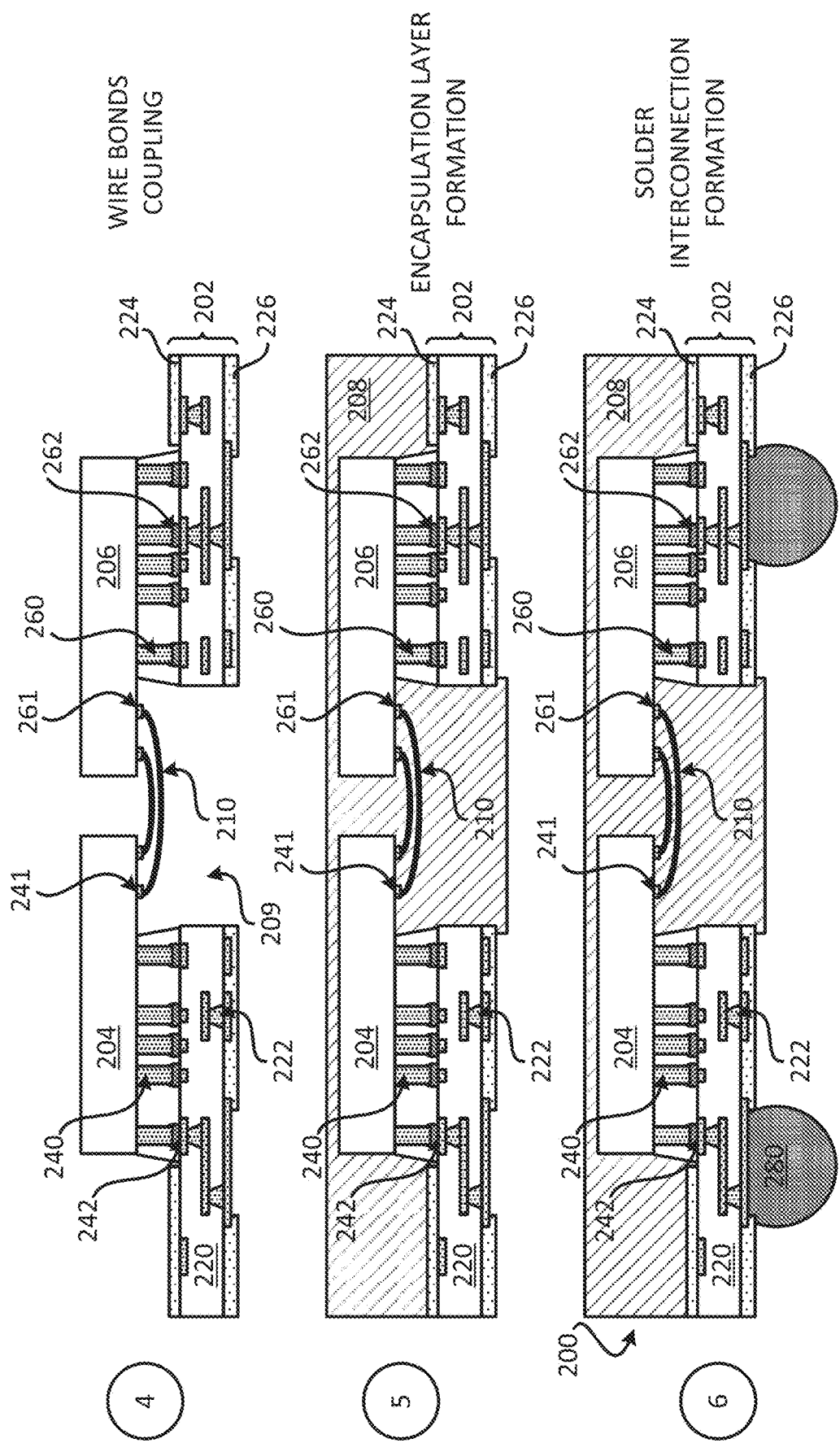

Exemplary Sequence for Fabricating a Package That Includes Wire Bonds Coupled to Integrated Devices FIGS. 12A-12B illustrate an exemplary sequence for providing or fabricating a package that includes wire bonds coupled to integrated devices. In some implementations, the sequence of FIGS. 12A-12B may be used to provide or fabricate the package 200 that includes the substrate 202 and wire bonds coupled to integrated devices of FIG. 2, or any of the packages described in the disclosure.

It should be noted that the sequence of FIGS. 12A-12B may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 12A-12B may be used to fabricate one package or several packages at a time (as part of a wafer).

Stage 1, as shown in FIG. 12A, illustrates a state after the substrate 202 is provided. The substrate 202 may be provided by a supplier or fabricated. A process similar to the process shown in FIGS. 10A-10C may be used to fabricate the substrate 202. However, different implementations may use different processes to fabricate the substrate 202. Examples of processes that may be used to fabricate the substrate 202 include a semi-additive process (SAP) and a modified semi-additive process (mSAP). The substrate 202 includes at least one dielectric layer 220, and a plurality of interconnects 222. The substrate 202 may be a laminate substrate, a coreless substrate, an organic substrate, a substrate that includes a core layer. In some implementations, the at least one dielectric layer 220 may include a core layer and/or prepreg layers. The substrate 202 includes a cavity 209. The cavity 209 may be fabricated using a laser process (e.g., laser ablation). The cavity 209 may be formed after the substrate 202 is fabricated and/or provided. In some implemented the substrate 202 is provided with the cavity 209.

Stage 2 illustrates a state after the integrated device 204 and the integrated device 206 are coupled to a first surface (e.g., top surface) of the substrate 202. The integrated device 204 is coupled to the substrate 202 through the plurality of pillar interconnects 240 and/or the plurality of solder interconnects 242. The integrated device 206 is coupled to the substrate 202 through the plurality of pillar interconnects 260 and/or the plurality of solder interconnects 262. Portions of the integrated device 204 and portions of the integrated device 206 may be located over the cavity 209. The integrated device 204 may be coupled to the substrate 202 such that the front side (e.g., active side) of the integrated device 204 is facing the substrate 202. Similarly, the integrated device 206 may be coupled to the substrate 202 such that the front side of the integrated device 206 is facing the substrate 202.

Stage 3 illustrates a state after an underfill 244 is provided (e.g., formed) between the substrate 202 and the integrated device 204, and an underfill 264 is provided (e.g., formed) between the substrate 202 and the integrated device 206. The underfill (e.g., 244, 264) may be provided around the pillar interconnects (e.g., 240, 260) and/or the solder interconnects (e.g., 242, 262) through capillary action and/or forces. The capillary properties of the underfill allow the underfill to fill the small space and/or small gap between the integrated devices and the substrate.

Stage 4, as shown in FIG. 12B illustrates a state after a plurality of wire bonds 210 is coupled to the first integrated device 204 and the second integrated device 206. For example, the plurality of wire bonds 210 may be formed between the first integrated device 204 and the second integrated device 206. The plurality of wire bonds 210 may be coupled to the plurality of pads 241 (of the first integrated device 204) and the plurality of pads 261 (of the second integrated device 206). The plurality of wire bonds 210 may be formed through the cavity 209 of the substrate 202. One advantage of forming the plurality of wire bonds 210 after the integrated devices have been coupled to the substrate is that the plurality of wire bonds 210 are less likely to break and/or fail due to movement between integrated devices since the integrated devices are relatively fixed relative to one another after coupling to the substrate. Examples of how the plurality of wire bonds 210 is coupled to the integrated devices are shown and described in at least FIGS. 4-6.

Stage 5 illustrates a state after the encapsulation layer 208 is formed over the first surface of the substrate 202 such that the encapsulation layer 208 encapsulates the first integrated device 204 and the second integrated device 206. The encapsulation layer 208 may encapsulate the plurality of wire bonds 210. The encapsulation layer 208 may at least partially fill the cavity 209 of the substrate 202. The process of forming and/or depositing the encapsulation layer 208 may include using a compression and transfer molding process, a sheet molding process, or a liquid molding process. It is noted that in some implementations, the encapsulation layer 208 may replace the underfill (e.g., 244, 264), as described in FIG. 7. Thus, in some implementations, the encapsulation layer 208 may be formed and located in regions that are occupied by the underfills 244 and/or 264.

Stage 6 illustrates a state after the plurality of solder interconnects 280 is coupled to the substrate 202. A reflow solder process may be used to couple the plurality of solder interconnects. Stage 8 may illustrate the package 200 that includes the substrate 202, the first integrated device 204, the second integrated device 206, the underfill 244, the underfill 264, and the encapsulation layer 208, as described in at least FIG. 2.

The packages (e.g., 200, 700) described in the disclosure may be fabricated one at a time or may be fabricated together as part of one or more wafers and then singulated into individual packages.

Figure 13:
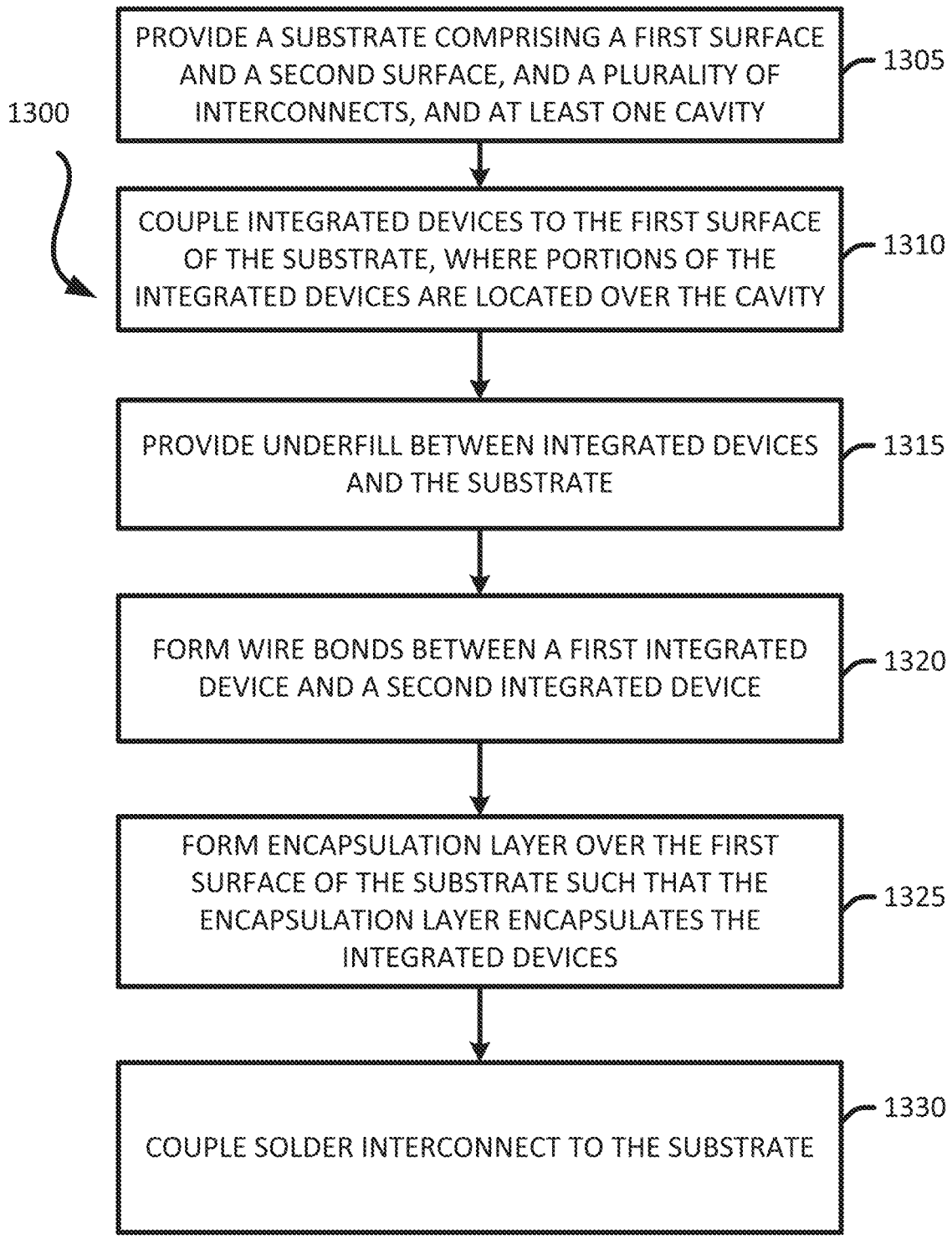
FIG. 13 illustrates an exemplary flow diagram of a method for fabricating a package that includes wire bonds coupled to integrated devices.

Exemplary Flow Diagram of a Method for Fabricating a Package that Includes Wire Bonds Coupled Integrated Devices In some implementations, fabricating a package that includes wire bonds couples between integrated device includes several processes. FIG. 13 illustrates an exemplary flow diagram of a method 1300 for providing or fabricating a package that includes wire bonds coupled to integrated devices. In some implementations, the method 1300 of FIG. 13 may be used to provide or fabricate the package 200 of FIG. 2 described in the disclosure. However, the method 1300 may be used to provide or fabricate any of the packages described in the disclosure.

It should be noted that the method of FIG. 13 may combine one or more processes in order to simplify and/or clarify the method for providing or fabricating a package that includes wire bonds couples to integrated devices. In some implementations, the order of the processes may be changed or modified.

The method provides (at 1305) a substrate (e.g., 202). The substrate 202 may be provided by a supplier or fabricated. The substrate 202 includes a first surface and a second surface. The substrate 202 includes at least one dielectric layer 220 and a plurality of interconnects 222. The substrate 202 may include at least one cavity 209. Different implementations may provide different substrates. A process similar to the process shown in FIGS. 10A-10C may be used to fabricate the substrate 202. However, different implementations may use different processes to fabricate the substrate 202, Stage 1 of FIG. 12A illustrates and describes an example of providing a substrate.

The method couples (at 1310) integrated devices to the substrate. For example, the method may couple the integrated device 204 and the integrated device 206 to a first surface (e.g., top surface) of the substrate 202. The integrated device 204 is coupled to the substrate 202 through the plurality of pillar interconnects 240 and/or the plurality of solder interconnects 242. The integrated device 206 is coupled to the substrate 202 through the plurality of pillar interconnects 260 and/or the plurality of solder interconnects 262. Portions of the integrated device 204 and portions of the integrated device 206 may be located over the cavity 209. The integrated device 204 may be coupled to the substrate 202 such that the front side (e.g., active side) of the integrated device 204 is facing the substrate 202. Similarly, the integrated device 206 may be coupled to the substrate 202 such that the front side of the integrated device 206 is facing the substrate 202. Stage 2 of FIG. 12A, illustrates and describes an example of coupling integrated devices to a substrate.

The method forms (at 1315) at least one underfill between the integrated devices and a substate. For example, the method may provide an underfill 244 between the substrate 202 and the integrated device 204, and an underfill 264 between the substrate 202 and the integrated device 206. The underfill (e.g., 244, 264) may be provided around the pillar interconnects (e.g., 240, 260) and/or the solder interconnects (e.g., 242, 262) through capillary action and/or forces. The capillary properties of the underfill allow the underfill to fill the small space and/or small gap between the integrated devices and the substrate. Stage 3 of FIG. 12A, illustrates and describes an example of providing an underfill.

The method couples (at 1320) a plurality of wire bonds 210 to the first integrated device 204 and the second integrated device 206. The plurality of wire bonds 210 may be formed between the first integrated device 204 and the second integrated device 206. The plurality of wire bonds 210 is coupled to the plurality of pads 241 (of the first integrated device 204) and the plurality of pads 261 (of the second integrated device 206). Examples of how the plurality of wire bonds 210 is coupled to the integrated devices are shown and described in at least FIGS. 4-6. Stage 4 of FIG. 12B, illustrates and describes an example of coupling wire bonds to integrated devices.

The method may form (at 1325) an encapsulation layer over a substrate. For example, the method may form the encapsulation layer 208 over the first surface of the substrate 202 such that the encapsulation layer 208 encapsulates the first integrated device 204 and the second integrated device 206. The encapsulation layer 208 may encapsulate the plurality of wire bonds 210. The encapsulation layer 208 may at least partially fill the cavity 209 of the substrate 202. The process of forming and/or depositing the encapsulation layer 208 may include using a compression and transfer molding process, a sheet molding process, or a liquid molding process, it is noted that in some implementations, the encapsulation layer 208 may replace the underfill (e.g., 244, 264), as described in FIG. 2. Thus, in some implementations, the encapsulation layer 208 may formed and located in regions that are occupied by the underfill. Stage 5 of FIG. 12B illustrates and describes an example of forming an encapsulation layer.

The method couples (at 1330) a plurality of solder interconnects (e.g., 280) to the second surface of the substrate (e.g., 202). A reflow solder process may be used to couple the plurality of solder interconnects. Stage 6 of FIG. 12B, illustrates and describes an example of coupling solder interconnects to the substrate.

Exemplary Electronic Devices

Figure 14:
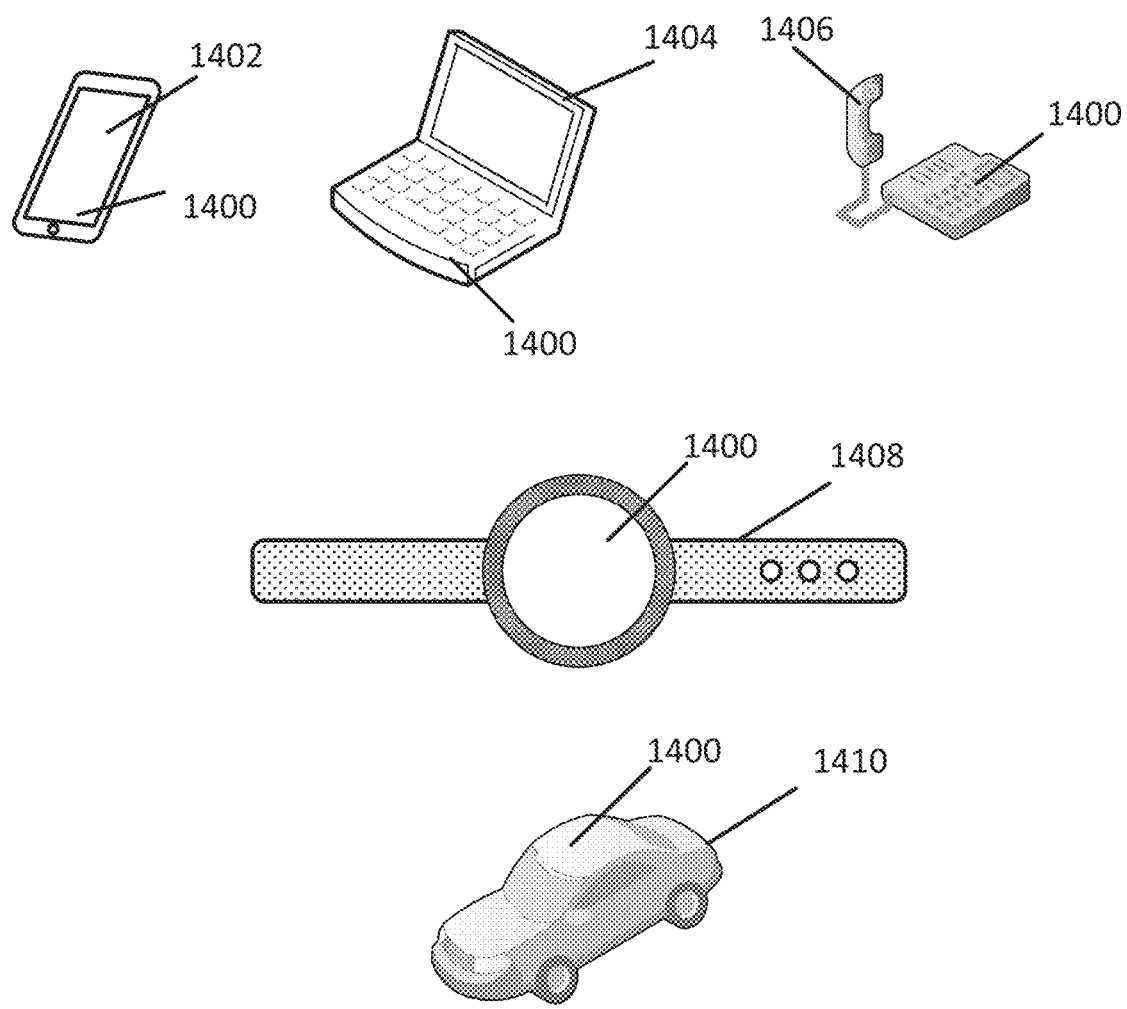
FIG. 14 illustrates various electronic devices that may integrate a die, an electronic circuit, an integrated device, an integrated passive device (IPD), a passive component, a package, and/or a device package described herein.

FIG. 14 illustrates various electronic devices that may be integrated with any of the aforementioned device, integrated device, integrated circuit (IC) package, integrated circuit (IC) device, semiconductor device, integrated circuit, die, interposer, package, package-on-package (Pop), System in Package (SiP), or System on Chip (SoC). For example, a mobile phone device 1402, a laptop computer device 1404, a fixed location terminal device 1406, a wearable device 1408, or automotive vehicle 1410 may include a device 1400 as described herein. The device 1400 may be, for example, any of the devices and/or integrated circuit (IC) packages described herein. The devices 1402, 1404, 1406 and 1408 and the vehicle 1410 illustrated in FIG. 14 are merely exemplary. Other electronic devices may also feature the device 1400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-7, 8A-8B, 9, 10A-10C, 11, 12A-12B, and/or 13-14 may be rearranged and/or combined into a single component, process, feature or function or embodied in several components, processes, or functions. Additional elements, components, processes, and/or functions may also be added without departing from the disclosure. It should also be noted FIGS. 2-7, 8A-8B, 9, 10A-10C, 11, 12A-12B, and/or 13-14 and its corresponding description in the present disclosure is not limited to dies and/or ICs. In some implementations, FIGS. 2-7, 8A-8B, 9, 10A-10C, 11, 12A-12B, and/or 13-14 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The following provides an overview of aspects of the present disclosure:

Aspect 1: A package comprising a substrate comprising a cavity; a first integrated device coupled to the substrate through a first plurality of pillar interconnects and a first plurality of solder interconnects; a second integrated device coupled to the substrate through a second plurality of pillar interconnects and a second plurality of solder interconnects; and a plurality of wire bonds coupled to the first integrated device and the second integrated device, wherein the plurality of wire bonds is located over (e.g., above, below) the cavity of the substrate.

Aspect 2: The package of aspect 1, wherein the plurality of wire bonds comprises: a first plurality of wire bonds coupled to the first integrated device and the second integrated device; and a second plurality of wire bonds coupled to the first integrated device and the second integrated device. A second vertical distance between the second plurality of wire bonds and the first integrated device is different than a first vertical distance between the first plurality of wire bonds and the first integrated device. The second plurality of wire bonds may be located partially over the first plurality of wire bonds. A vertical distance between the wire bond and a surface of an integrated device and/or a pad of the integrated device, may be a vertical perpendicular distance relative to the surface of the integrated device and/or pad of the of the integrated device. The first vertical distance may be a first maximum vertical distance. The second vertical distance may be a second maximum vertical distance.

Aspect 3: The package of aspects 1 through 2, wherein the first integrated device comprises a first row of a plurality of pads and a second row of a plurality of pads, wherein the second integrated device comprises a first row of a plurality of pads and a second row of a plurality of pads, and wherein the plurality of wire bonds comprises: a first plurality of wire bonds coupled to (i) the first row of the plurality of pads of the first integrated device and (ii) the first row of the plurality of pads of the second integrated device, and a second plurality of wire bonds coupled to (i) the second row of the plurality of pads of the first integrated device and (ii) the second row of the plurality of pads of the second integrated device.

Aspect 4: The package of aspect 3, wherein the first row of the plurality of pads from the first integrated device is staggered relative to the second row of the plurality of pads from the first integrated device.

Aspect 5: The package of aspects 1 through 4, wherein the plurality of wire bonds between the first integrated device and the second integrated device has a density of at least 40 wire bonds per millimeter.

Aspect 6: The package of aspects 1 through 5, wherein each wire bond from the plurality of wire bonds has a minimum diameter of 15 micrometers.

Aspect 7: The package of aspects 1 through 6, further comprising an underfill located (i) between the first integrated device and the substrate, and (ii) between the second integrated device and the substrate. In some implementations, the underfill comprises an encapsulation layer.

Aspect 8: The package of aspect 7, wherein the underfill comprises a viscosity of approximately 10-30 pascal second (Pa·s).

Aspect 9: The package of aspects 7 through 8, wherein the underfill comprises a capillary underfill and/or a mold underfill.

Aspect 10: The package of aspects 1 through 9, further comprising an encapsulation layer located over the substrate, the first integrated device and the second integrated device.

Aspect 11: The package of aspect 10, wherein the cavity of the substrate is at least partially filled with the encapsulation layer. In some implementations, the cavity of the substrate is completely filled with the encapsulation layer.

In some implementations, aspect 1 may be a package comprising a substrate comprising a cavity; a first integrated device coupled to the substrate through a first plurality of interconnects; a second integrated device coupled to the substrate through a second plurality of interconnects; and a plurality of wire bonds coupled to the first integrated device and the second integrated device, wherein the plurality of wire bonds is located over (e.g., above, below) the cavity of the substrate. The first plurality of interconnects may include a first plurality of solder interconnects. The second plurality of interconnects may include a second plurality of solder interconnects.

In some implementations, aspect 1 may be a package comprising a substrate; a first integrated device coupled to the substrate through a first plurality of pillar interconnects and a first plurality of solder interconnects; a second integrated device coupled to the substrate through a second plurality of pillar interconnects and a second plurality of solder interconnects; and a plurality of wire bonds coupled to the first integrated device and the second integrated device.

Aspect 12: An apparatus comprising a substrate comprising a cavity; a first integrated device coupled to the substrate through a first plurality of pillar interconnects and a first plurality of solder interconnects; a second integrated device coupled to the substrate through a second plurality of pillar interconnects and a second plurality of solder interconnects; and means for wire interconnection coupled to the first integrated device and the second integrated device, wherein the means for wire interconnection is located over (e.g., above, below) the cavity of the substrate.

Aspect 13: The apparatus of aspect 12, wherein the means for wire interconnection comprises: a first plurality of wire bonds coupled to the first integrated device and the second integrated device; and a second plurality of wire bonds coupled to the first integrated device and the second integrated device, wherein a second vertical distance between the second plurality of wire bonds and the first integrated device is different than a first vertical distance between the first plurality of wire bonds and the first integrated device. The second plurality of wire bonds may be located partially over the first plurality of wire bonds. A vertical distance between the wire bond and a surface of an integrated device and/or a pad of the integrated device, may be a vertical perpendicular distance relative to the surface of the integrated device and/or pad of the of the integrated device. The first vertical distance may be a first maximum vertical distance. The second vertical distance may be a second maximum vertical distance.

Aspect 14: The apparatus of aspects 12 through 13, wherein the first integrated device comprises a first row of a plurality of pads and a second row of a plurality of pads, wherein the second integrated device comprises a first row of a plurality of pads and a second row of a plurality of pads, and wherein the means for wire interconnection comprises: a first plurality of wire bonds coupled to (i) the first row of the plurality of pads of the first integrated device and (ii) the first row of the plurality of pads of the second integrated device, and a second plurality of wire bonds coupled to (i) the second row of the plurality of pads of the first integrated device and GO the second row of the plurality of pads of the second integrated device.

Aspect 15: The apparatus of aspect 14, wherein the first row of the plurality of pads from the first integrated device is staggered relative to the second row of the plurality of pads from the first integrated device.

Aspect 16: The apparatus of aspects 12 through 15, wherein the means for wire interconnection between the first integrated device and the second integrated device has a density of at least 40 wire bonds per millimeter.

Aspect 17: The apparatus of aspects 12 through 16, wherein each wire bond from the means for wire interconnection has a minimum diameter of 15 micrometers.

Aspect 18: The apparatus of aspects 12 through 17, further comprising an underfill located (i) between the first integrated device and the substrate, and (ii) between the second integrated device and the substrate. In some implementations, the underfill comprises an encapsulation layer.

Aspect 19: The apparatus of aspects 12 through 18, further comprising a means for encapsulation located over the substrate, the first integrated device and the second integrated device.

Aspect 20: The apparatus of aspect 19, wherein the means for encapsulation is further located in the cavity of the substrate. The cavity of the substrate may be at least partially filled with the means for encapsulation. The cavity of the substrate may be completely filled with the means for encapsulation.

Aspect 21: The apparatus of aspects 12 through 20, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

In some implementations, aspect 12 may be an apparatus comprising a substrate comprising a cavity; a first integrated device coupled to the substrate through a first plurality of interconnects; a second integrated device coupled to the substrate through a second plurality of interconnects; and means for wire interconnection coupled to the first integrated device and the second integrated device, wherein the means for wire interconnection is located over (e.g., above, below) the cavity of the substrate. The first plurality of interconnects may include a first plurality of solder interconnects. The second plurality of interconnects may include a second plurality of solder interconnects.

In some implementations, aspect 12 may be an apparatus comprising a substrate; a first integrated device coupled to the substrate through a first plurality of pillar interconnects and a first plurality of solder interconnects; a second integrated device coupled to the substrate through a second plurality of pillar interconnects and a second plurality of solder interconnects; and means for wire interconnection coupled to the first integrated device and the second integrated device.

Aspect 22: A method for fabricating a package, comprising providing a substrate comprising a cavity; coupling a first integrated device to the substrate through a first plurality of pillar interconnects and a first plurality of solder interconnects; coupling a second integrated device to the substrate through a second plurality of pillar interconnects and a second plurality of solder interconnects; and forming a plurality of wire bonds between the first integrated device and the second integrated device, wherein the plurality of wire bonds is located over (e.g., above, below) the cavity of the substrate.

Aspect 23: The method of aspect 22, wherein forming the plurality of wire bonds comprises: coupling a first plurality of wire bonds to the first integrated device and the second integrated device; and coupling a second plurality of wire bonds to the first integrated device and the second integrated device, wherein a second vertical distance between the second plurality of wire bonds and the first integrated device is different than a first vertical distance between the first plurality of wire bonds and the first integrated device. The second plurality of wire bonds may be located partially over the first plurality of wire bonds. A vertical distance between the wire bond and a surface of an integrated device and/or a pad of the integrated device, may be a vertical perpendicular distance relative to the surface of the integrated device and/or pad of the of the integrated device. The first vertical distance may be a first maximum vertical distance. The second vertical distance may be a second maximum vertical distance.

Aspect 24: The method of aspects 22 through 23, wherein the first integrated device comprises a first row of a plurality of pads and a second row of a plurality of pads, wherein the second integrated device comprises a first row of a plurality of pads and a second row of a plurality of pads, and wherein forming the plurality of wire bonds comprises: coupling a first plurality of wire bonds to (i) the first row of the plurality of pads of the first integrated device and (ii) the first row of the plurality of pads of the second integrated device, and coupling a second plurality of wire bonds to (i) the second row of the plurality of pads of the first integrated device and (ii) the second row of the plurality of pads of the second integrated device.

Aspect 25: The method of aspect 24, wherein the first row of the plurality of pads from the first integrated device is staggered relative to the second row of the plurality of pads from the first integrated device.

Aspect 26: The method of aspects 22 through 25, wherein the plurality of wire bonds between the first integrated device and the second integrated device is formed with a density of at least 40 wire bonds per millimeter.

Aspect 27: The method of aspects 22 through 26, further comprising forming an underfill located (i) between the first integrated device and the substrate, and (ii) between the second integrated device and the substrate.

Aspect 28: The method of aspects 22 through 27, further comprising forming an encapsulation layer located over the substrate, the first integrated device and the second integrated device.

Aspect 29: The method of aspect 28, wherein the encapsulation layer is further formed at least partially in the cavity of the substrate.

In some implementations, aspect 22 may be a method for fabricating a package, comprising providing a substrate comprising a cavity; coupling a first integrated device to the substrate through a first plurality of interconnects; coupling a second integrated device to the substrate through a second plurality of interconnects; and forming a plurality of wire bonds between the first integrated device and the second integrated device, wherein the plurality of wire bonds is located over (e.g., above, below) the cavity of the substrate. The first plurality of interconnects may include a first plurality of solder interconnects. The second plurality of interconnects may include a second plurality of solder interconnects.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
    a substrate comprising a cavity;
    a first integrated device coupled to the substrate through a first plurality of pillar interconnects and a first plurality of solder interconnects, wherein the first integrated device comprises a first front side that faces in a direction towards the substrate;
    a second integrated device coupled to the substrate through a second plurality of pillar interconnects and a second plurality of solder interconnects, wherein the second integrated device comprises a second front side that faces in a direction towards the substrate; and
    a plurality of wire bonds coupled to the first front side of the first integrated device and the second front side of the second integrated device,
    wherein the plurality of wire bonds is located between (i) at least part of the cavity of the substrate and the first front side of the first integrated device, and (ii) at least part of the cavity of the substrate and the second front side of the second integrated device,
    wherein the plurality of wire bonds is located over the cavity of the substrate,
    wherein the plurality of wire bonds comprises:
        a first plurality of wire bonds coupled to the first integrated device and the second integrated device, wherein a portion of the first plurality of wire bonds is located at a first maximum vertical distance from a surface of the first integrated device; and
        a second plurality of wire bonds coupled to the first integrated device and the second integrated device, wherein a portion of the second plurality of wire bonds is located at a second maximum vertical distance from the surface of the first integrated device,
    wherein the second maximum vertical distance is different from the first maximum vertical distance.

2. The package of claim 1,
    wherein the portion of the first plurality of wire bonds that is located at the first maximum vertical distance from the surface of the first integrated device is a part of the first plurality of wire bonds that is vertically offset farthest away from the surface of the first integrated device, and
    wherein the portion of the second plurality of wire bonds that is located at the second maximum vertical distance from the surface of the first integrated device is a part of the second plurality of wire bonds that is vertically offset farthest away from the surface of the first integrated device.

3. The package of claim 1,
    wherein the first integrated device comprises a first row of pads and a second row of pads,
    wherein the second integrated device comprises a first row of pads and a second row of pads,
    wherein the first plurality of wire bonds are coupled to (i) the first row of pads of the first integrated device and (ii) the first row of pads of the second integrated device, and
    wherein the second plurality of wire bonds are coupled to (i) the second row of pads of the first integrated device and (ii) the second row of pads of the second integrated device.

4. The package of claim 3, wherein a plan view of the package, the first row of pads from the first integrated device is staggered relative to the second row of pads from the first integrated device such that the first row of pads of the first integrated device are further away from the second integrated device than the second row of pads of the first integrated device.

5. The package of claim 1, wherein the plurality of wire bonds between the first integrated device and the second integrated device has a density of at least 40 wire bonds per millimeter.

6. The package of claim 1, wherein each wire bond from the plurality of wire bonds has a minimum diameter of 15 micrometers.

7. The package of claim 1, further comprising an underfill located (i) between the first integrated device and the substrate, and (ii) between the second integrated device and the substrate.

8. The package of claim 7, wherein the underfill comprises a viscosity of approximately 10-30 pascal second (Pa·s).

9. The package of claim 7, wherein the underfill comprises a capillary underfill and/or a mold underfill.

10. The package of claim 1, further comprising an encapsulation layer located over the substrate, the first integrated device and the second integrated device.

11. The package of claim 10, wherein the cavity of the substrate is at least partially filled with the encapsulation layer.

12. The package of claim 1, wherein the package is part of a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

13. A method for fabricating a package, comprising:
    providing a substrate comprising a cavity;
    coupling a first integrated device to the substrate through a first plurality of pillar interconnects and a first plurality of solder interconnects, wherein the first integrated device comprises a first front side that faces in a direction towards the substrate;
    coupling a second integrated device to the substrate through a second plurality of pillar interconnects and a second plurality of solder interconnects, wherein the second integrated device comprises a second front side that faces in a direction towards the substrate; and
    forming a plurality of wire bonds that is coupled to (i) the first front side of the first integrated device and (ii) the second front side of the second integrated device,
    wherein the plurality of wire bonds is located between (i) at least part of the cavity of the substrate and the first front side of the first integrated device, and (ii) at least part of the cavity of the substrate and the second front side of the second integrated device,
    wherein the plurality of wire bonds is located over the cavity of the substrate, wherein the plurality of wire bonds comprises:
        a first plurality of wire bonds coupled to the first integrated device and the second integrated device, wherein a portion of the first plurality of wire bonds is located at a first maximum vertical distance from a surface of the first integrated device; and a second plurality of wire bonds coupled to the first integrated device and the second integrated device, wherein a portion of the second plurality of wire bonds is located at a second maximum vertical distance from the surface of the first integrated device, wherein the second maximum vertical distance is different from the first maximum vertical distance.

14. The method of claim 13, wherein forming the plurality of wire bonds comprises:

coupling a first plurality of wire bonds to the first integrated device and the second integrated device, wherein the portion of the first plurality of wire bonds that is located at the first maximum vertical distance from the surface of the first integrated device is a part of the first plurality of wire bonds that is vertically offset farthest away from the surface of the first integrated device; and coupling a second plurality of wire bonds to the first integrated device and the second integrated device, wherein the portion of the second plurality of wire bonds that is located at the second maximum vertical distance from the surface of the first integrated device is a part of the second plurality of wire bonds that is vertically offset farthest away from the surface of the first integrated device.

15. The method of claim 13, wherein the first integrated device comprises a first row of pads and a second row of pads, wherein the second integrated device comprises a first row of pads and a second row of pads, wherein the first plurality of wire bonds are coupled to (i) the first row of pads of the first integrated device and (ii) the first row of pads of the second integrated device, and wherein the second plurality of wire bonds are coupled to (i) the second row of pads of the first integrated device and (ii) the second row of pads of the second integrated device.

16. The method of claim 15, wherein a plan view of the package, the first row of pads from the first integrated device is staggered relative to the second row of pads from the first integrated device such that the first row of pads of the first integrated device are further away from the second integrated device than the second row of pads of the first integrated device.

17. The method of claim 13, wherein the plurality of wire bonds between the first integrated device and the second integrated device is formed with a density of at least 40 wire bonds per millimeter.

18. The method of claim 13, further comprising forming an underfill located (i) between the first integrated device and the substrate, and (ii) between the second integrated device and the substrate.

19. The method of claim 13, further comprising forming an encapsulation layer located over the substrate, the first integrated device and the second integrated device.

20. The method of claim 19, wherein the encapsulation layer is further formed at least partially in the cavity of the substrate.

21. The package of claim 2, wherein the first plurality of wire bonds includes the first wire bond and the second plurality of wire bonds includes the second wire bond.

22. The package of claim 3, wherein the first row of pads of the first integrated device includes the first pad and the second row of pads of the first integrated device includes the second pad.

23. The package of claim 3, wherein the first row of pads of the first integrated device and the first row of pads of the second integrated device are separated by a first distance, wherein the second row of pads of the first integrated device and the second row of pads of the second integrated device are separated by a second distance, and wherein the second distance is less than the first distance.

24. The package of claim 23, wherein the first plurality of wire bonds that are coupled to (i) the first row of pads of the first integrated device and (ii) the first row of pads of the second integrated device, vertically overlap with at least part of (i) the second row of pads of the first integrated device and (ii) the second row of pads of the second integrated device.

25. The package of claim 23, wherein the first plurality of wire bonds and the second plurality of wire bonds are arranged in an interleave manner such that a first wire bond from the first plurality of wire bonds is immediately adjacent to a second wire bond and a third wire bond from the second plurality of wire bonds.

* * * * *